United States Patent
Ikegami et al.

(10) Patent No.: US 10,460,784 B2
(45) Date of Patent: Oct. 29, 2019

(54) MAGNETIC MEMORY AND MEMORY SYSTEM

(71) Applicant: Kabushiki Kaisha Toshiba, Tokyo (JP)

(72) Inventors: Kazutaka Ikegami, Tokyo (JP);
Tomoaki Inokuchi, Kanagawa (JP);
Satoshi Takaya, Kanagawa (JP);
Shinobu Fujita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 16/118,880

(22) Filed: Aug. 31, 2018

(65) Prior Publication Data
US 2019/0295621 A1 Sep. 26, 2019

(30) Foreign Application Priority Data
Mar. 20, 2018 (JP) .................... 2018-053056

(51) Int. Cl.
*G11C 11/16* (2006.01)
*H01L 27/22* (2006.01)
*H01L 43/02* (2006.01)
*H01F 10/32* (2006.01)

(52) U.S. Cl.
CPC ........ *G11C 11/1673* (2013.01); *G11C 11/161* (2013.01); *G11C 11/1675* (2013.01); *H01L 27/228* (2013.01); *H01L 43/02* (2013.01); *G11C 11/1655* (2013.01); *H01F 10/3272* (2013.01); *H01F 10/3286* (2013.01)

(58) Field of Classification Search
None
See application file for complete search history.

(56) References Cited

U.S. PATENT DOCUMENTS

| | | | |
|---|---|---|---|
| 6,856,537 | B2 | 2/2005 | Tanizaki et al. |
| 6,930,922 | B2 | 6/2005 | Mori et al. |
| 7,233,537 | B2 | 6/2007 | Tanizaki et al. |
| 9,520,171 | B2 | 12/2016 | Inokuchi et al. |
| 2010/0182824 | A1* | 7/2010 | Nebashi ............ B82Y 10/00 365/158 |

(Continued)

FOREIGN PATENT DOCUMENTS

| | | |
|---|---|---|
| JP | 2004-5797 A | 1/2004 |
| JP | 2004-63018 A | 2/2004 |

(Continued)

*Primary Examiner* — Tan T. Nguyen
(74) *Attorney, Agent, or Firm* — Finnegan, Henderson, Farabow, Garrett & Dunner, L.L.P.

(57) ABSTRACT

According to one embodiment, a magnetic memory includes: a memory cell including a first magnetoresistive effect element; a reference circuit including a second magnetoresistive effect element having a first resistance state and a third magnetoresistive effect element having a second resistance state; and a read circuit configured to read data in the memory cell based on a first signal based on an output from the memory cell and a second signal based on an output from the reference circuit. At a time of reading of the data, a first voltage is applied to the first magnetoresistive effect element, and a second voltage higher than the first voltage is applied to the second magnetoresistive effect element and the third magnetoresistive effect element.

18 Claims, 18 Drawing Sheets

(56) References Cited

U.S. PATENT DOCUMENTS

| | | | | |
|---|---|---|---|---|
| 2013/0044535 A1* | 2/2013 | Shimakawa | ......... | G11C 13/004 |
| | | | | 365/148 |
| 2014/0321195 A1* | 10/2014 | Antonyan | .......... | G11C 13/0021 |
| | | | | 365/148 |
| 2015/0092469 A1* | 4/2015 | Kim | .................... | G11C 11/1673 |
| | | | | 365/148 |
| 2015/0170726 A1* | 6/2015 | Antonyan | ........... | G11C 11/1673 |
| | | | | 365/158 |
| 2016/0027488 A1* | 1/2016 | Kim | .................... | G11C 11/1673 |
| | | | | 365/148 |
| 2016/0035402 A1* | 2/2016 | Antonyan | ........... | G11C 11/1655 |
| | | | | 365/63 |

FOREIGN PATENT DOCUMENTS

| | | |
|---|---|---|
| JP | 2008-084525 A | 4/2008 |
| JP | 2013-161502 A | 8/2013 |
| JP | 2015-61043 A | 3/2015 |

\* cited by examiner

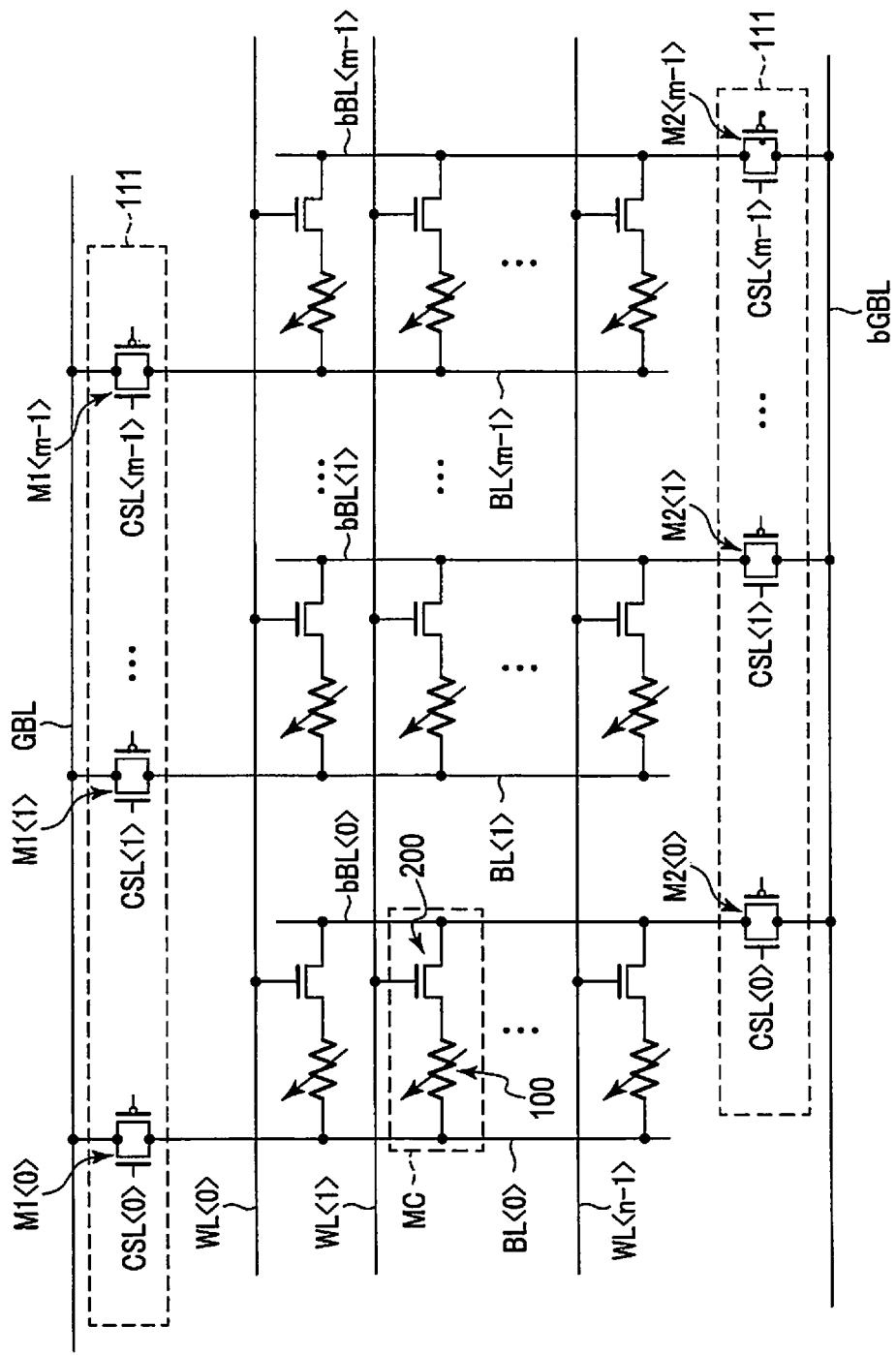
F I G. 4

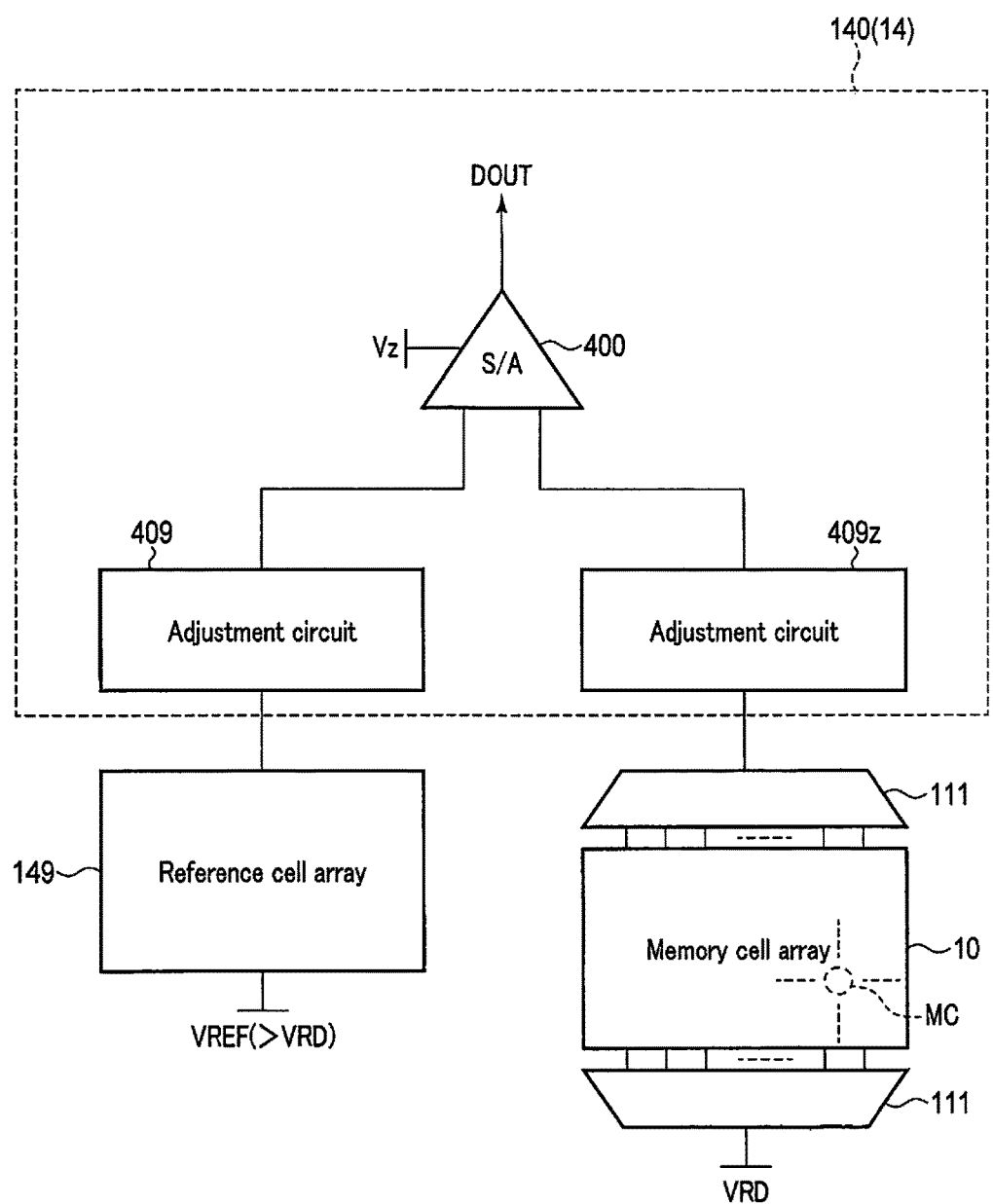
F I G. 7

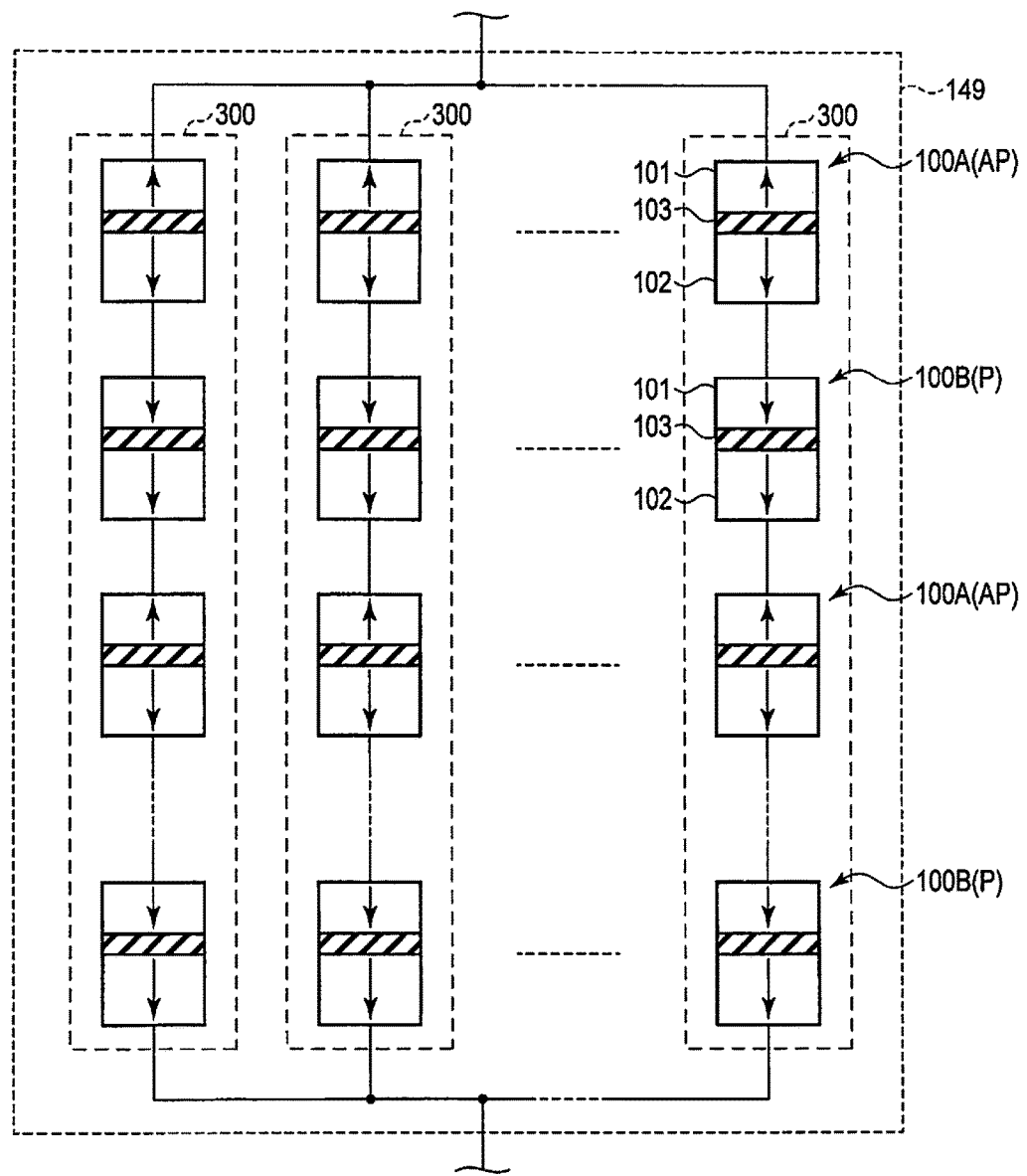
F I G. 8

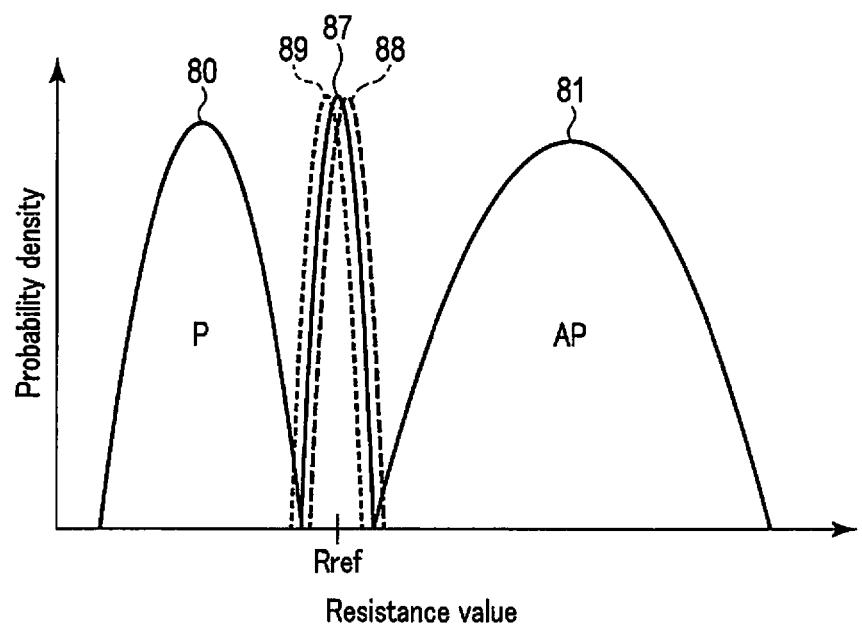
F I G. 9
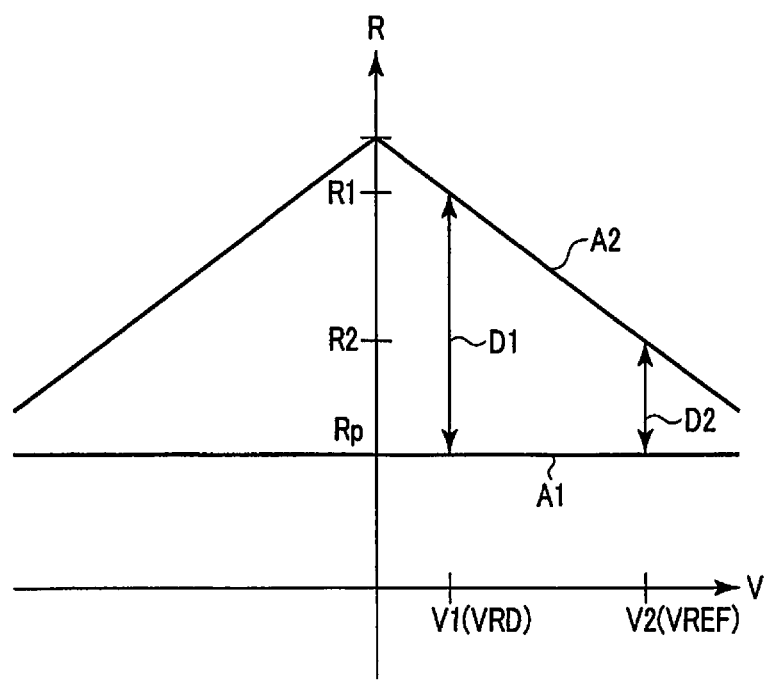
F I G. 10

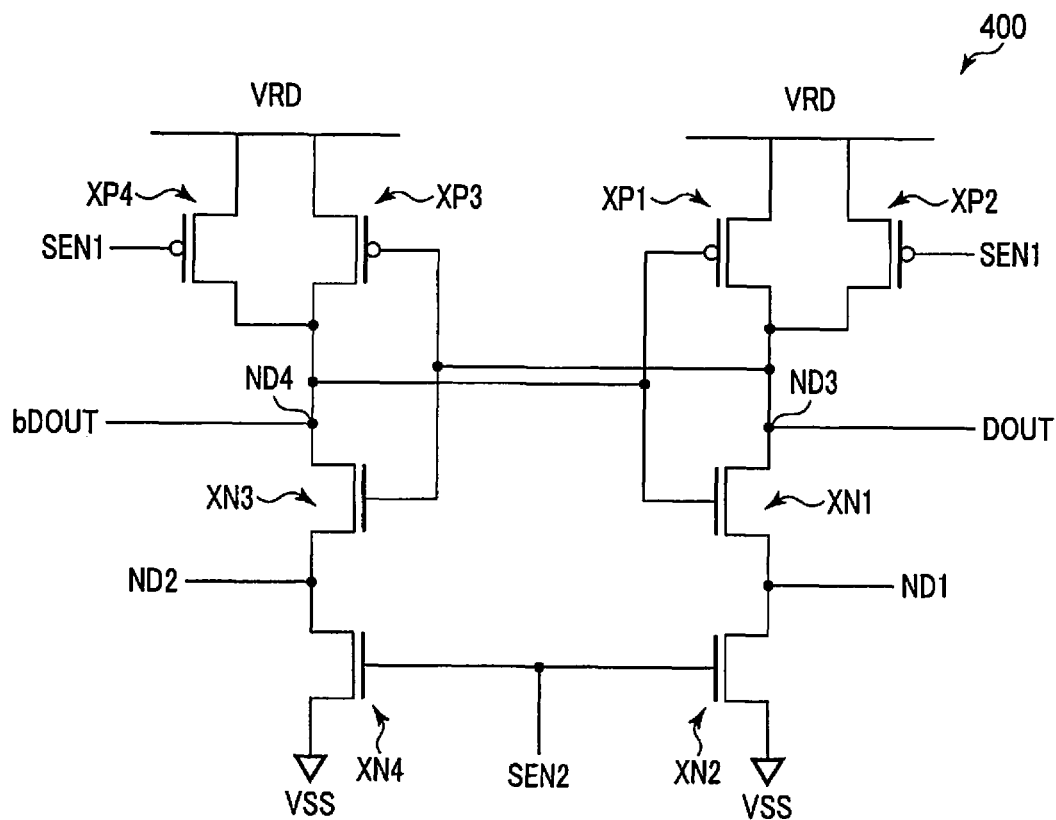
F I G. 12
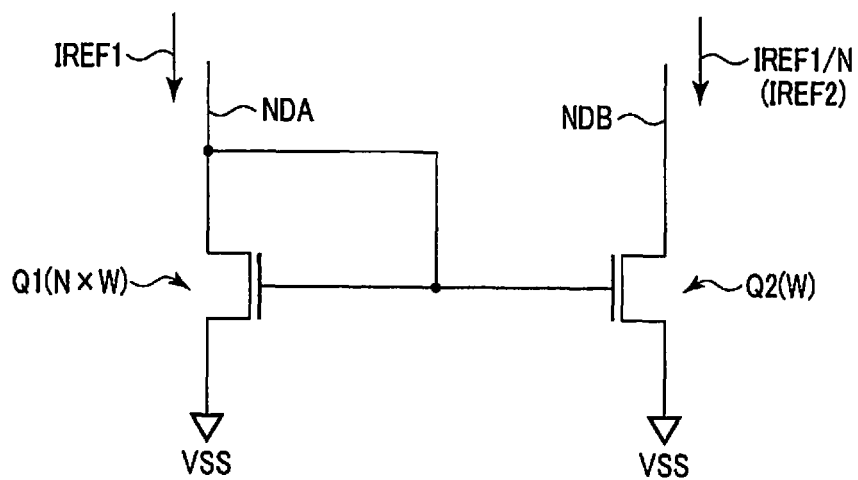
F I G. 13

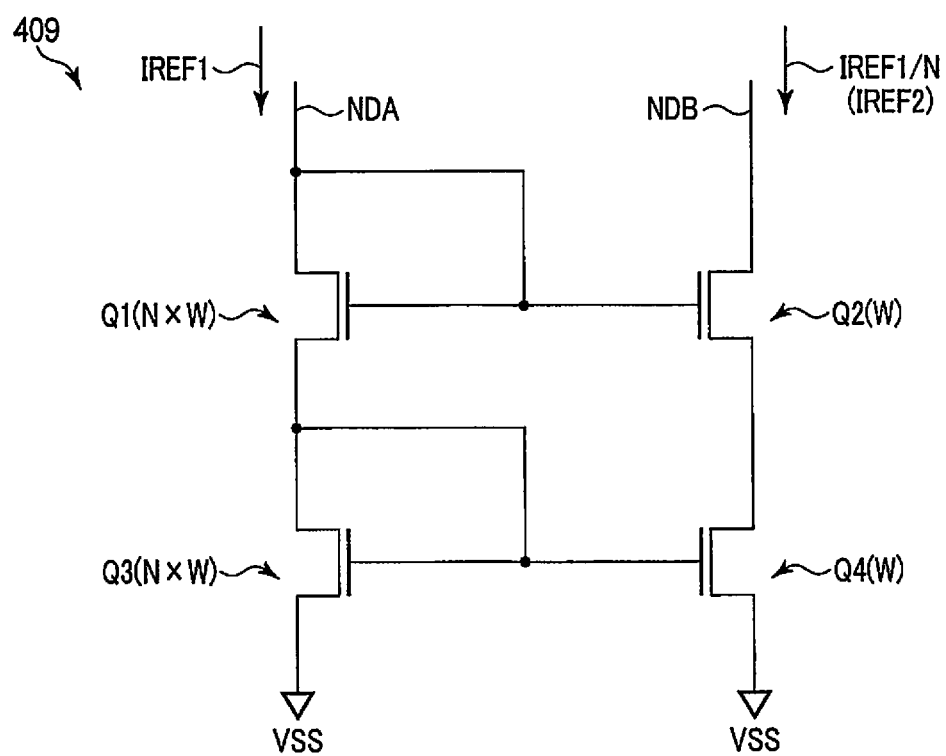
F I G. 14

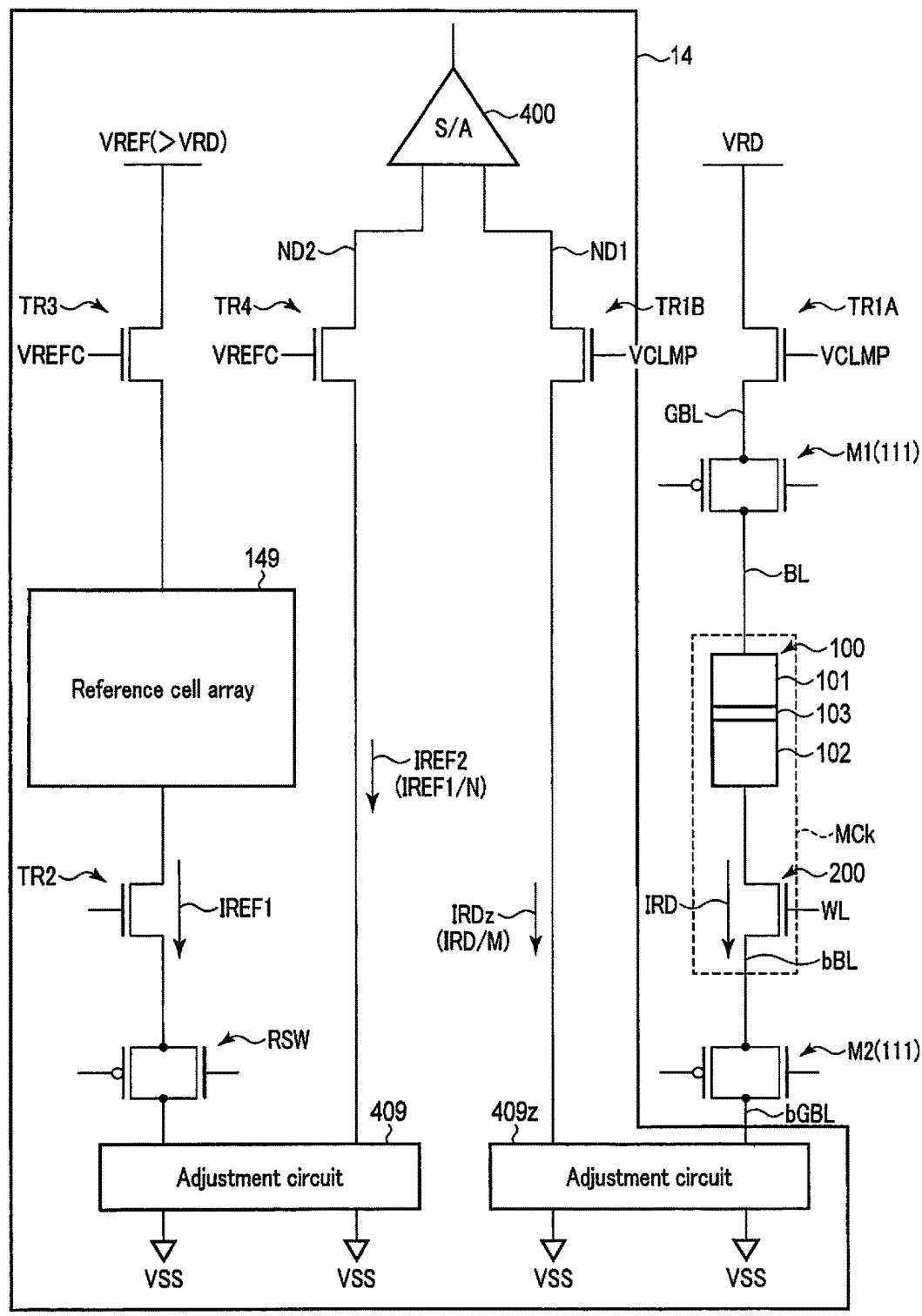
F I G. 15

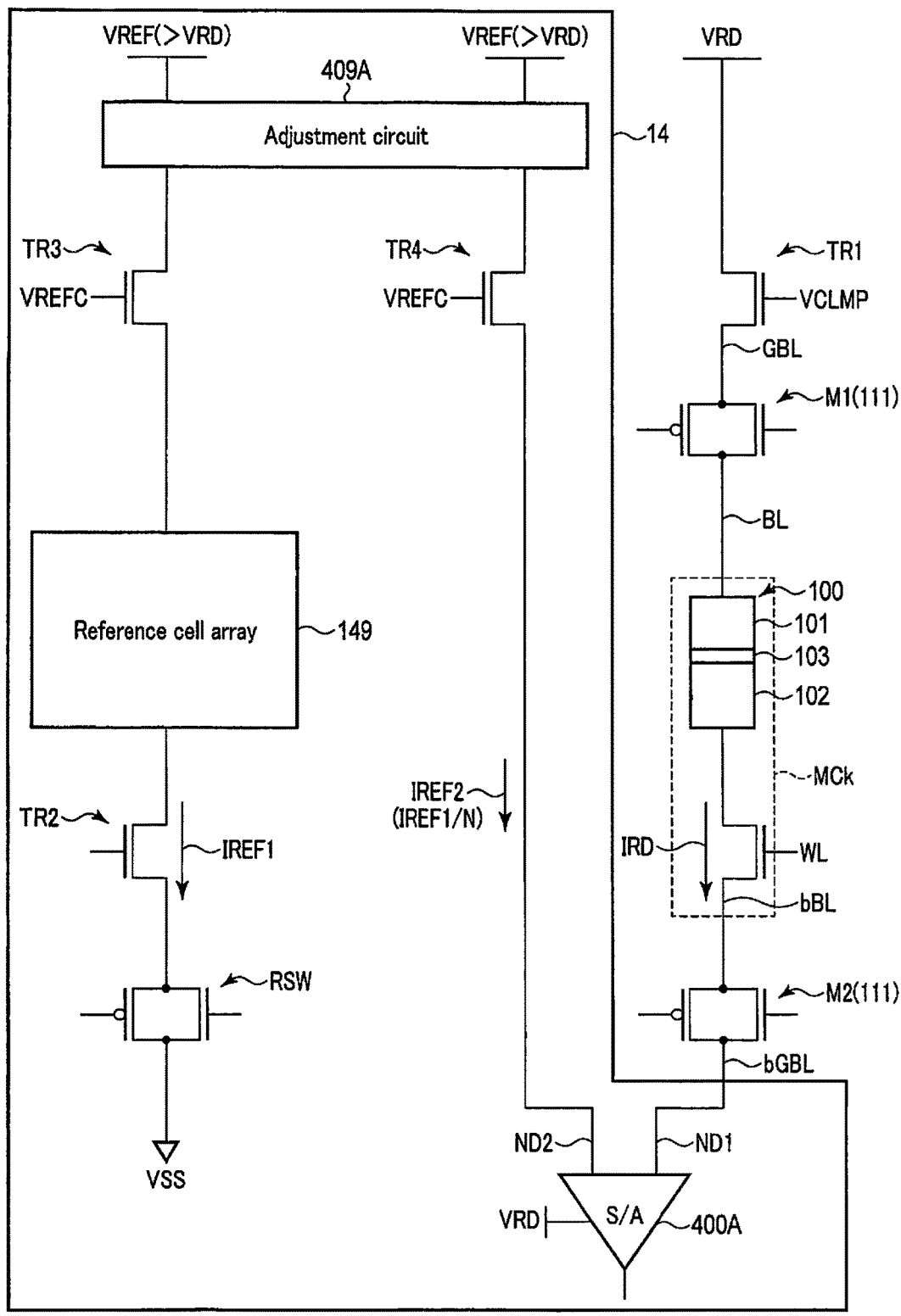
F I G. 16

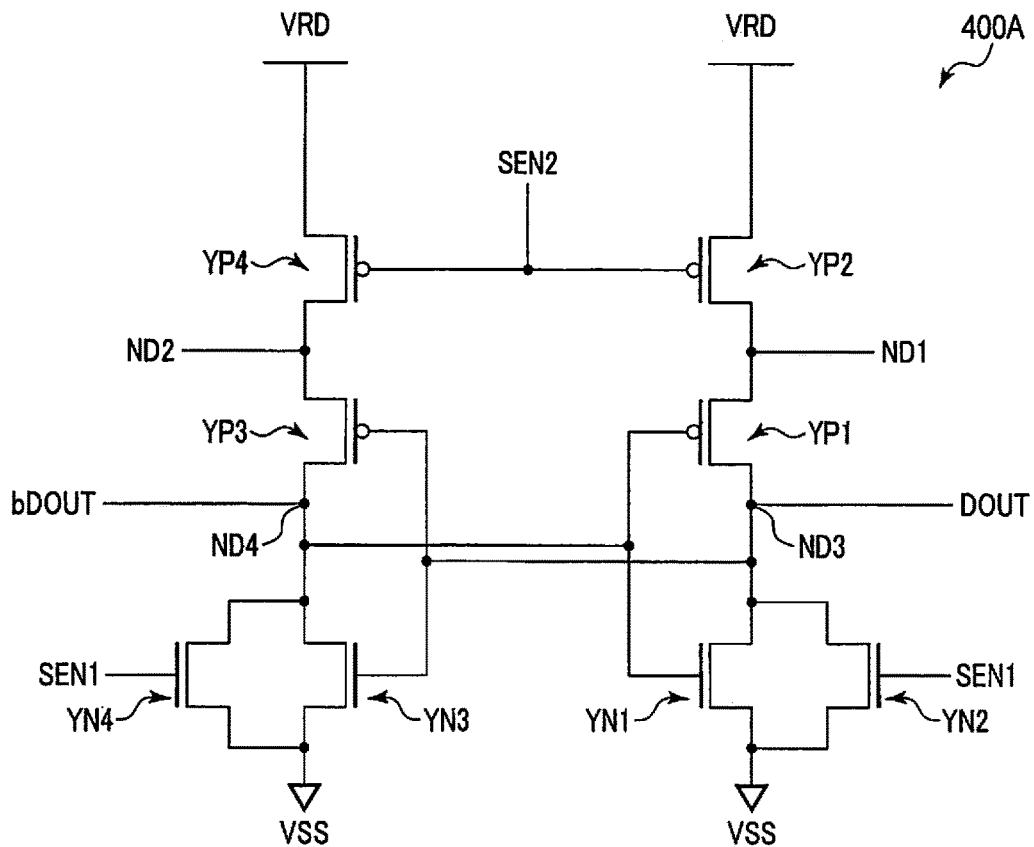
F I G. 17
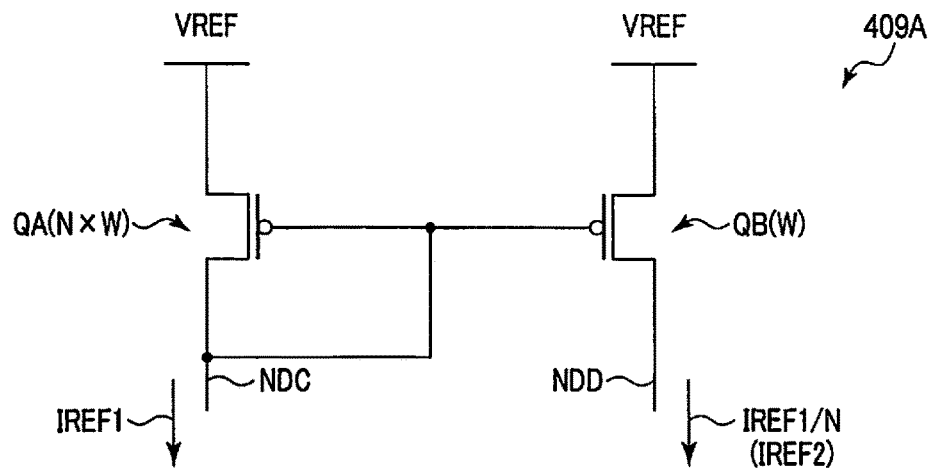
F I G. 18

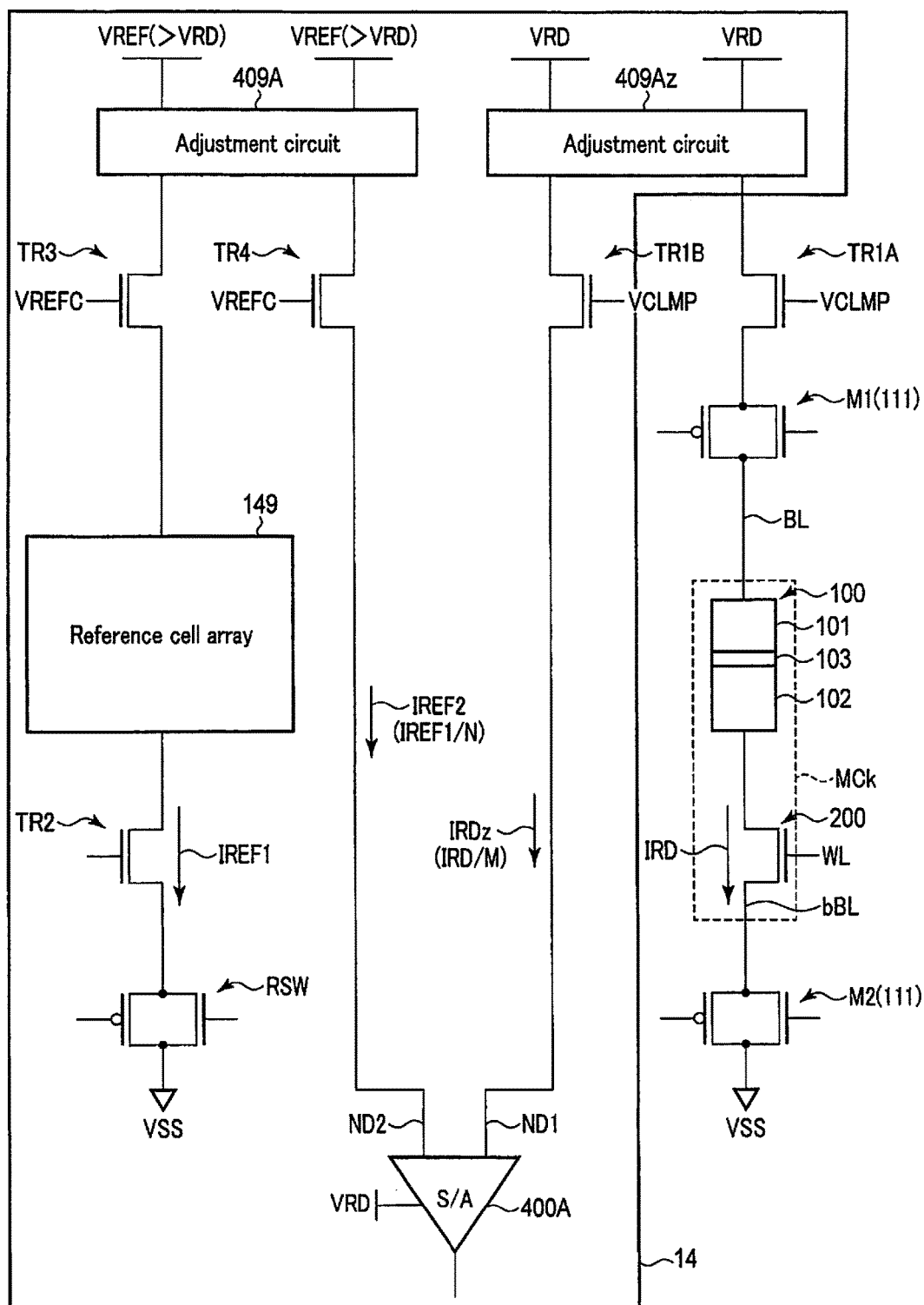
F I G. 20

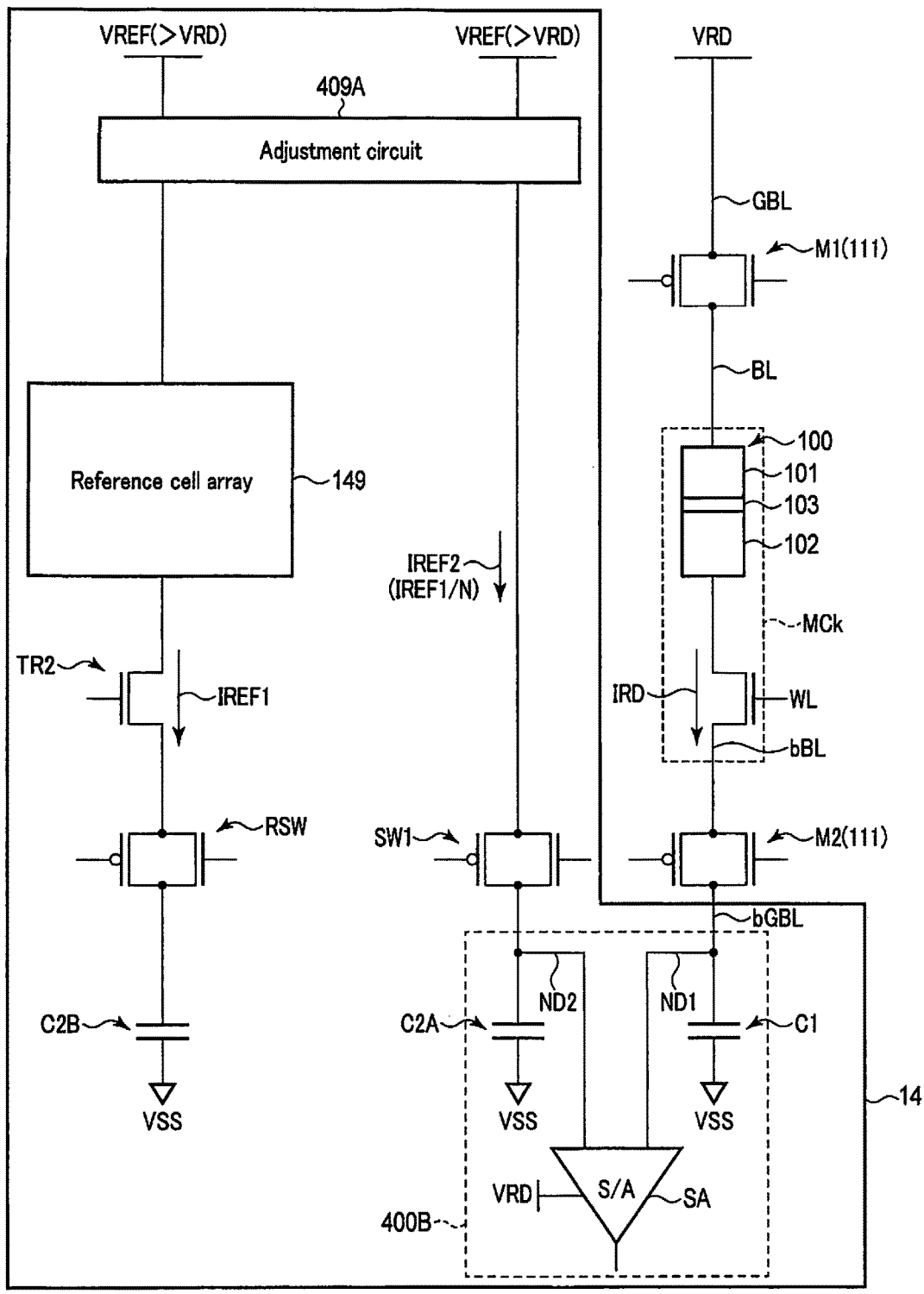
F I G. 21

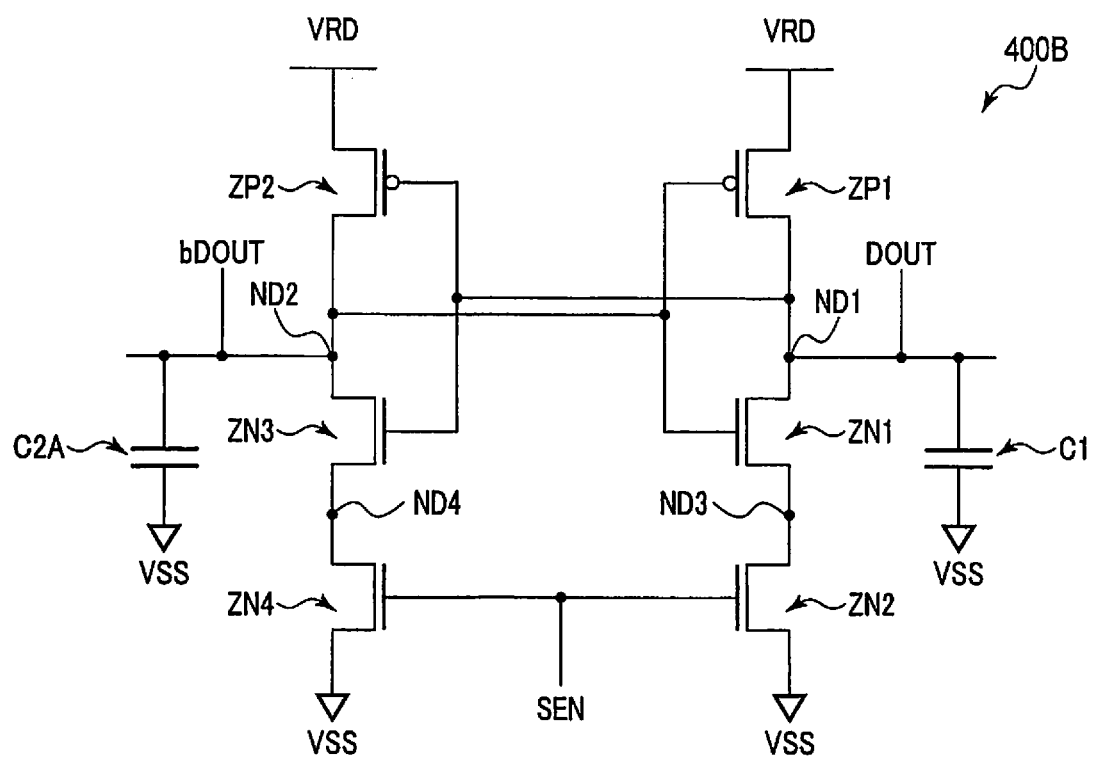
F I G. 22

MAGNETIC MEMORY AND MEMORY SYSTEM

CROSS-REFERENCE TO RELATED APPLICATIONS

This application is based upon and claims the benefit of priority from Japanese Patent Application No. 2018-053056, filed Mar. 20, 2018, the entire contents of which are incorporated herein by reference.

FIELD

Embodiments described herein relate generally to a magnetic memory and a memory system.

BACKGROUND

As a substitute memory for a volatile memory such as an SRAM or a DRAM, a nonvolatile memory such as an MRAM has received attention.

To improve the characteristics and functions of the nonvolatile memory, research and development of the circuit configuration of the memory, the configuration and structure of memory cells, and various kinds of operations such as data writing and data reading have been promoted.

BRIEF DESCRIPTION OF THE DRAWINGS

FIG. 4 is an equivalent circuit diagram showing an example of the memory cell array of the magnetic memory according to the first embodiment;

FIGS. 7 and 8 are views showing a configuration example of the magnetic memory according to the first embodiment;

FIGS. 9 and 10 are views for explaining the operation mechanism of the magnetic memory according to the first embodiment;

FIGS. 11, 12, and 13 are views showing a configuration example of the magnetic memory according to the first embodiment;

FIG. 14 is a view showing a configuration example of a magnetic memory according to the second embodiment;

FIG. 15 is a view showing a configuration example of a magnetic memory according to the third embodiment;

FIGS. 16, 17, 18, and 19 are views showing a configuration example of a magnetic memory according to the fourth embodiment;

FIG. 20 is a view showing a configuration example of a magnetic memory according to the fifth embodiment;

FIGS. 21 and 22 are views showing a configuration example of a magnetic memory according to the sixth embodiment.

DETAILED DESCRIPTION

Figure 1:
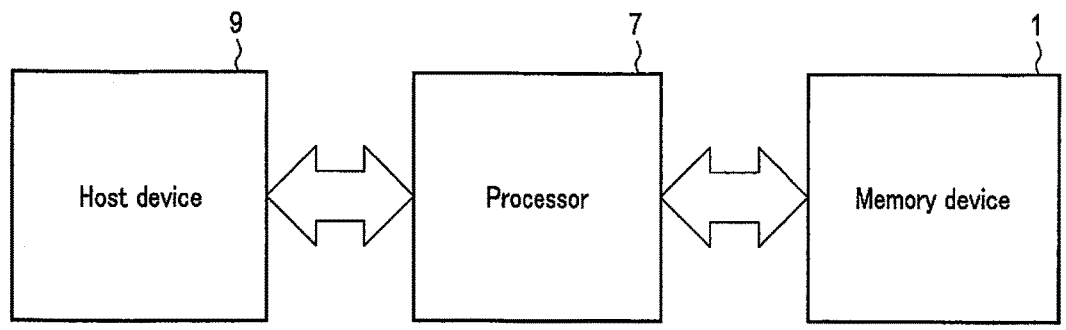
FIG. 1 is a block diagram showing a configuration example of a system including a magnetic memory according to the first embodiment.

In general, according to one embodiment, a magnetic memory includes: a memory cell including a first magnetoresistive effect element; a reference circuit including a second magnetoresistive effect element having a first resistance state and a third magnetoresistive effect element having a second resistance state; and a read circuit configured to read data in the memory cell based on a first signal based on an output from the memory cell and a second signal based on an output from the reference circuit. At a time of reading of the data, a first voltage is applied to the first magnetoresistive effect element, and a second voltage higher than the first voltage is applied to the second magnetoresistive effect element and the third magnetoresistive effect element.

EMBODIMENTS

A magnetic memory according to each embodiment and a control method thereof will be described with reference to FIGS. 1, 2, 3, 4, 5, 6, 7, 8, 9, 10, 11, 12, 13, 14, 15, 16, 17, 18, 19, 20, 21, 22, and 23.

In the following explanation, the same reference numerals denote constituent elements having the same functions and configurations. In the following embodiments, when constituent elements (for example, word lines WL, bit lines BL, and various kinds of voltages and signals) having numerals/letters added at ends of reference numerals for differentiation are not distinguished from each other, an expression in which the last number/letter is omitted is used.

(1) First Embodiment

A magnetic memory according to the first embodiment and a control method (operation) thereof will be described with reference to FIGS. 1 to 13.

(a) Configuration Example

A configuration example of the magnetic memory according to the first embodiment will be described with reference to FIGS. 1 to 9.

FIG. 1 is a block diagram showing an example of a system including the magnetic memory according to this embodiment.

As shown in FIG. 1, the system includes a magnetic memory 1 according to this embodiment, a processor 7, and a host device 9.

The magnetic memory (memory device) 1 according to this embodiment includes a magnetoresistive effect element serving as a memory element.

The magnetic memory 1 is directly or indirectly connected to the processor 7. For example, the magnetic memory 1 constitutes a storage class memory, a main memory (for example, a working memory), or a cache memory.

The host device 9 can request, via the processor 7, the magnetic memory 1 to do various kinds of operations such as data writing (storage), data reading, and data erase.

The processor (or controller) 7 is directly or indirectly coupled with the host device 9 via a connection terminal, a connector, or a cable.

The processor 7 can control the operation of the magnetic memory 1. The processor 7 includes a buffer memory, an ECC circuit, and the like.

The processor 7 generates a command based on a request from the host device 9. The processor 7 transmits the generated command to the magnetic memory 1.

The magnetic memory 1 executes an operation corresponding to the command from the processor 7.

For example, in a case in which the request from the host device 9 is data writing, the processor 7 transmits a write command to the magnetic memory 1. The processor 7 transmits the address of a memory cell to be selected, data to be written to the memory cell, and a control signal together with the write command. Based on the write command and the control signal, the magnetic memory 1 writes the data to be written to the selected address.

For example, in a case in which the request from the host device 9 is data reading, the processor 7 transmits a read command to the memory device. The processor 7 transmits the address of a memory cell to be selected and a control signal together with the read command. Based on the read command and the control signal, the magnetic memory 1 reads data from the selected address. The data reading from the magnetic memory 1 is transmitted to the host device via the processor 7.

In this way, the magnetic memory 1 executes a predetermined operation in the system.

At least one of the processor 7 and the host device 9 will be referred to as an external device hereinafter. For example, the host device 9 is at least one device selected from a portable telephone, a smartphone, a portable terminal, a game device, a home appliance, a personal computer, and the like.

Note that the magnetic memory 1 according to this embodiment may be a memory in the processor 7 or in the host device 9. In this case, the magnetic memory 1 is controlled by a controller in the processor 7 or a CPU (or a controller) in the host device 9. Additionally, in this embodiment, the processor 7 may be provided in the host device 9.

Figure 2:
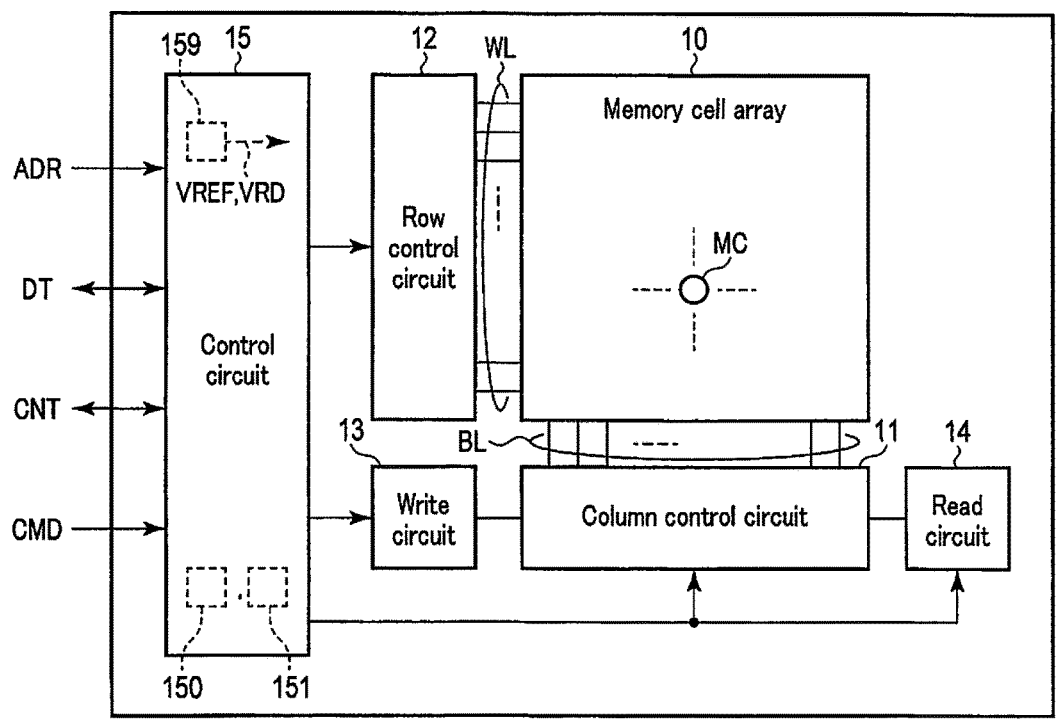
FIG. 2 is a block diagram showing a configuration example of the magnetic memory according to the first embodiment.

FIG. 2 is a block diagram showing the internal configuration of the magnetic memory according to this embodiment.

As shown in FIG. 2, the magnetic memory according to this embodiment includes a memory cell array 10, a column control circuit 11, a row control circuit 12, a write circuit 13, a read circuit 14, a control circuit 15, and the like.

The memory cell array 10 includes at least a plurality of bit lines BL, a plurality of word lines WL, and a plurality of memory cells MC. One memory cell MC is connected to the word line WL and the bit line BL.

The column control circuit 11 controls the columns (for example, the bit lines BL) of the memory cell array 10. Based on the address (to be referred to as a selected address hereinafter) of an operation target memory cell, the column control circuit 11 sets at least one bit line of the plurality of bit lines BL in a selected state. The bit line set in the selected state will be referred to as a selected bit line hereinafter. Bit lines other than the selected bit line will be referred to as unselected bit lines.

The row control circuit 12 controls the rows (for example, the word lines WL) of the memory cell array 10. Based on the selected address, the row control circuit 12 sets one word line of the plurality of word lines WL in the selected state. The word line set in the selected state will be referred to as a selected word line hereinafter. Word lines other than the selected word line will be referred to as unselected word lines.

The write circuit (also called a write control circuit or a write driver) 13 performs various kinds of control for a write operation (data writing). For example, the write circuit 13 includes a voltage source (or current source), a latch circuit, and the like.

The read circuit (also called a read control circuit or a read driver) 14 performs various kinds of control for a read operation (data reading). The configuration of the read circuit 14 will be described later.

Note that the write circuit 13 and the read circuit 14 are not limited to circuits independent of each other. For example, the write circuit and the read circuit may be provided as one integral circuit including common constituent elements usable for each other.

The control circuit (also called a sequencer, a state machine, or an internal controller) 15 controls the internal operation of the magnetic memory 1.

The control circuit 15 includes an input/output circuit (to be expressed as an I/O circuit hereinafter) 150 configured to transmit/receive signals ADR, DT, CNT, and CMD. The I/O circuit 150 functions as an interface circuit between the external device 7 and the magnetic memory 1.

The I/O circuit 150 receives and transmits the various kinds of signals ADR, DT, CNT, and CMD from the processor 7 (or the host device 9).

The I/O circuit 150 receives the data (to be also referred to as write data hereinafter) DT to be written to the memory cell array 10. The I/O circuit 150 transmits the write data DT to the write circuit 13. The I/O circuit 150 receives, via the read circuit 14, the data (to be also referred to as read data hereinafter) DT read from the memory cell array 10. The I/O circuit 150 transmits the read data DT to the processor 7.

The control circuit 15 includes a decoding circuit 151 configured to decode the address (selected address) ADR from the processor 7.

The decoding circuit 151 decodes the selected address ADR. The decoding circuit 151 transmits the decoding result of the address ADR to the row control circuit 12 and the column control circuit 11. The selected address (for example, a physical address) ADR includes a column address to be selected and a row address to be selected.

The control circuit 15 controls the operations of the circuits 11 to 14 in the magnetic memory 1 based on the control signal CNT and the command CMD. The command CMD is provided from the external device 7 or 9 to the magnetic memory 1. The control signal CNT is transmitted/received between the magnetic memory 1 and the external device 7 or 9.

For example, the command CMD is a signal representing an operation to be executed by the magnetic memory 1. For example, the control signal CNT is a signal to control the operation timing between the external device 7 or 9 and the magnetic memory 1 and the internal operation timing of the magnetic memory 1.

For example, the control circuit 15 includes a voltage generation circuit 159. The voltage generation circuit 159 generates voltages VRD and VREF used for the operation of the magnetic memory 1. In addition, the control circuit 15 includes a latch circuit (not shown) that temporarily holds the signals ADR, DT, CNT, and CMD.

Note that the magnetic memory 1 may include a circuit other than the above-described circuits 11 to 15. For example, the magnetic memory 1 may further include an ECC circuit.

For example, the magnetic memory 1 according to this embodiment is an MRAM.

<Configuration Example of Memory Cell Array>

Figure 3:
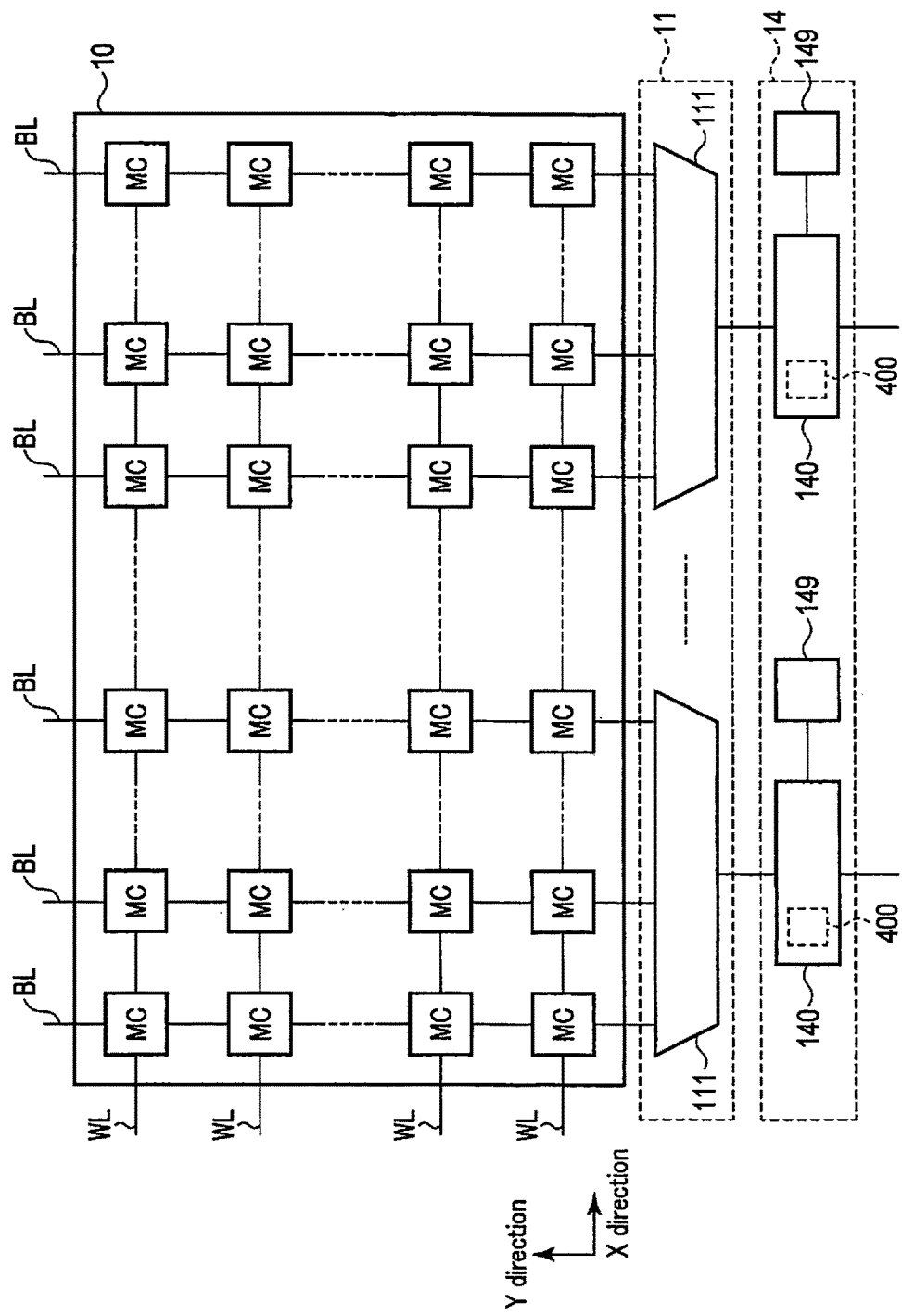
FIG. 3 is a view showing an example of the internal configuration of the magnetic memory according to the first embodiment.

FIG. 3 is a view schematically showing a configuration example of the memory cell array 10 and circuits in the neighborhood in the MRAM according to this embodiment.

As shown in FIG. 3, the plurality of memory cells MC are arranged in a matrix in the memory cell array 10.

The plurality of memory cells MC arranged in the X direction (row direction) are commonly connected to the word line WL. The memory cell MC is selected (activated) by controlling the potential of the word line WL corresponding to the selected address ADR by the row control circuit 12.

The plurality of memory cells MC arranged in the Y direction (column direction) are connected to the common bit line BL.

The bit lines BL are connected to a column selection circuit (switch circuit) 111 in the column control circuit 11. The column selection circuit 111 selects (activates) one of the plurality of bit lines BL connected to the column selection circuit 111 in accordance with the selected address ADR.

For example, the memory cell array 10 includes a plurality of regions BK divided in the X direction. In this case, a plurality of column selection circuits 111 are provided in the column control circuit 11. The number of column selection circuits 111 equals the number of regions BK in the memory cell array 10.

One column selection circuit 111 corresponds to one region BK. Accordingly, the write operation or the read operation can be executed for the plurality of regions BK in parallel.

The read circuit 14 includes one or more read sections 140 and one or more reference cell arrays (reference circuits) 149.

The read sections 140 are in a one-to-one correspondence with the regions BK. The reference cell array 149 is connected to the read section 140. The reference cell arrays 149 are in a one-to-one correspondence with the read sections 140.

The read circuit 14 includes one or more sense amplifier circuits 400. The sense amplifier circuit 400 is provided in the read section 140. The sense amplifier circuits 400 are in a one-to-one correspondence with the column selection circuits ill. The sense amplifier circuit 400 is connected to the output terminal of the column selection circuit 111.

The sense amplifier circuit 400 in the read section 140 senses and amplifies a signal from the memory cell array 10 (memory region BK) and a signal from the reference cell array 149. The sense amplifier circuit 400 compares the signal from the memory cell array 10 with the signal from the reference cell array 149.

Based on the result of comparison between the two signals by the sense amplifier circuit 400, data in the selected memory cell MC in the memory cell array 10 is discriminated.

FIG. 4 is an equivalent circuit diagram showing an example of the internal configuration of the memory cell array of the MRAM according to this embodiment.

As shown in FIG. 4, in the memory cell array 10 (or the region BK), the memory cell MC is connected between two bit lines BL and bBL. The two bit lines BL and bBL form one bit line pair. In order to distinguish the explanation, the bit line bBL will also be referred to as a source line hereinafter.

The plurality of bit line BL (BL<0>, BL<1>, ..., BL<m−1>), the plurality of source lines bBL (bBL<0>, bBL<1>, ..., bBL<m−1>), and the plurality of word lines WL (WL<0>, WL<1>, ..., WL<n−1>) are provided in the memory cell array 10.

The memory cell MC includes a magnetoresistive effect element 100 and a cell transistor 200.

One terminal of the magnetoresistive effect element 100 is connected to the bit line BL, the other terminal of the magnetoresistive effect element is connected to one end (one of the source/drains) of the current path of the cell transistor 200, and the other end (the other of the source/drains) of the current path of the cell transistor 200 is connected to the source line bBL. The gate of the cell transistor 200 is connected to the word line WL.

The column selection circuits 111 include a plurality of switches M1 (M1<0>, M1<1>, ..., M1<m−1>) and M2 (M2<0>, M2<1>, ..., M2<m−1>).

The plurality of switches M1 are in a one-to-one correspondence with the plurality of bit lines BL. The plurality of switches M1 are connected to one global bit line GBL.

One terminal of the switch M1 is connected to the global bit line GBL, and the other terminal of the switch M1 is connected to the bit line BL.

The plurality of switches M2 are in a one-to-one correspondence with the plurality of source lines bBL. The plurality of switches M2 are connected to one global bit line bGBL.

One terminal of the switch M2 is connected to the source line bBL, and the other terminal of the switch M2 is connected to the global bit line bGBL.

The sense amplifier circuit 400 is connected to one of the global bit lines GBL and bGBL, and a read driver (not shown) is connected to the other of the global bit lines GBL and bGBL. The read driver includes a voltage source (a high voltage terminal and a ground terminal) or a current source (a current source and a current sink).

Each of the switches M1 and M2 is on/off-controlled by a corresponding control signal CSL (CSL<0>, CSL<1>, ..., CSL<m−1>). The signal level of the control signal CSL is controlled based on the selected address ADR.

When the potential of the word line WL corresponding to the selected address is set to the ON voltage (threshold voltage) of the cell transistor 200 or more, the cell transistor 200 is set in an ON state. Accordingly, the memory cell MC selected in association with a row of the memory cell array 10 is activated.

The bit lines BL and bBL corresponding to the selected address are connected to the global bit lines GBL and bGBL via the switches M1 and M2 in the ON state. Accordingly, the memory cell MC selected in association with a column of the memory cell array 10 is connected to the sense amplifier circuit 400.

Note that in the MRAM according to this embodiment, the memory cell array 10 may have a cross-point structure.

<Configuration Example of Magnetoresistive Effect Element>

Figure 5:
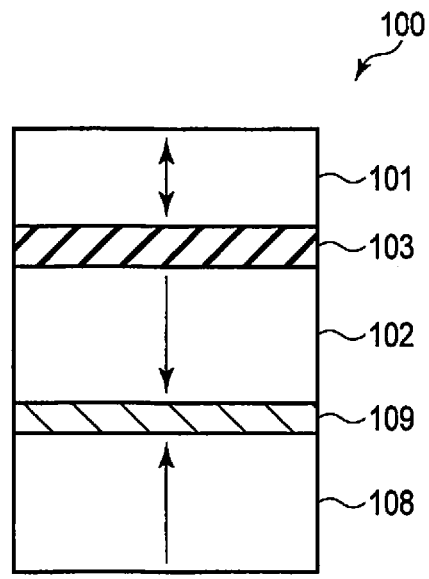
FIG. 5 is a view showing a configuration example of a memory element of the magnetic memory according to the first embodiment.

FIG. 5 is a schematic sectional view for explaining the structure of the magnetoresistive effect element of the MRAM according to this embodiment.

As shown in FIG. 5, the magnetoresistive effect element 100 includes at least two magnetic layers 101 and 102 and a nonmagnetic layer 103.

Each of the two magnetic layers 101 and 102 has magnetization. The direction of magnetization of the magnetic layer 101 is variable. The direction of magnetization of the magnetic layer 102 is invariable (fixed state).

In this embodiment, the magnetic layer 101 having a variable direction of magnetization is called a storage layer (or free layer) 101, and the magnetic layer 102 having an invariable (fixed) direction of magnetization is called a reference layer (or fixed layer, pin layer, or pinned layer) 102.

Note that in this embodiment, "the direction of magnetization of the reference layer is invariable" or "the direction of magnetization of the reference layer is fixed" means that in a case in which a current or voltage used to change the direction of magnetization of the storage layer is supplied to the magnetoresistive effect element, the direction of magnetization of the reference layer is not changed by the supplied current or voltage before and after the supply of the current/voltage.

The nonmagnetic layer 103 is provided between the two magnetic layers 101 and 102. The nonmagnetic layer 103 functions as a tunnel barrier layer 103. For example, the tunnel barrier layer 103 is an insulating layer including magnesium oxide.

For example, a magnetic tunnel junction is formed by the two magnetic layers 101 and 102 and the tunnel barrier layer 103. In this embodiment, the magnetoresistive effect element 100 having a magnetic tunnel junction is called an MTJ element 100.

For example, the magnetic layers 101 and 102 have perpendicular magnetic anisotropy. The directions of magnetization (easy magnetization axis directions) of the magnetic layers 101 and 102 are substantially perpendicular to the layer surfaces of the magnetic layers 101 and 102. The direction of magnetizations of the magnetic layers 101 and 102 are substantially parallel to the stacking direction of the plurality of layers 101, 102, and 103. The perpendicular magnetic anisotropy of the magnetic layers 101 and 102 is generated using the interface magnetic anisotropy of the magnetic layer and the like. The MTJ element using the perpendicular magnetic anisotropy of the magnetic layer is called a perpendicular magnetization type MTJ element.

A magnetic layer 108 may be provided to be adjacent to the reference layer 102 with the insertion of a spacer layer 109. The magnetic layer 108 may be provided on the opposite side of the side of the tunnel barrier layer 103 in the reference layer 102. The magnetic layer 108 is also called a shift cancel layer 108. The shift cancel layer 108 is a magnetic layer for reducing the stray magnetic field of the reference layer 102. The direction of magnetization of the shift cancel layer 108 is opposite to the direction of magnetization of the reference layer 102. This suppresses the adverse effect (for example, magnetic field shift) of the stray magnetic field of the reference layer 102 on the magnetization of the storage layer 101.

The direction of magnetization of the reference layer 102 and the direction of magnetization of the shift cancel layer 108 are set to oppose each other by a SAF (Synthetic AntiFerromagnetic) structure.

In the SAF structure, the reference layer 102 and the shift cancel layer 108 are antiferromagnetically coupled by the spacer layer 109 between the reference layer 102 and the shift cancel layer 108.

The spacer layer 109 is, for example, a nonmagnetic metal film such as a ruthenium (Ru) film. For example, when Ru is used in the spacer layer 109, the ferromagnetic coupling force between the reference layer 102 and the shift cancel layer 108 can be strengthen by adjusting the film thickness of the spacer layer 109. Accordingly, the direction of magnetization of the reference layer 102 and the direction of magnetization of the shift cancel layer 108 are stabilized in an antiparallel state.

Note that the directions of magnetization of the reference layer 102 and the shift cancel layer 108 need only be antiparallel to each other and are not limited to the directions of magnetization shown in FIG. 5.

In some cases, the stacked body (SAF structure) including the magnetic layers 102 and 108 and the spacer layer 109 is called a reference layer as a whole.

The resistance state (resistance value) of the MTJ element 100 changes in accordance with the relative relationship (magnetization alignment) between the direction of magnetization of the storage layer 101 and the direction of magnetization of the reference layer 102.

Figure 6:
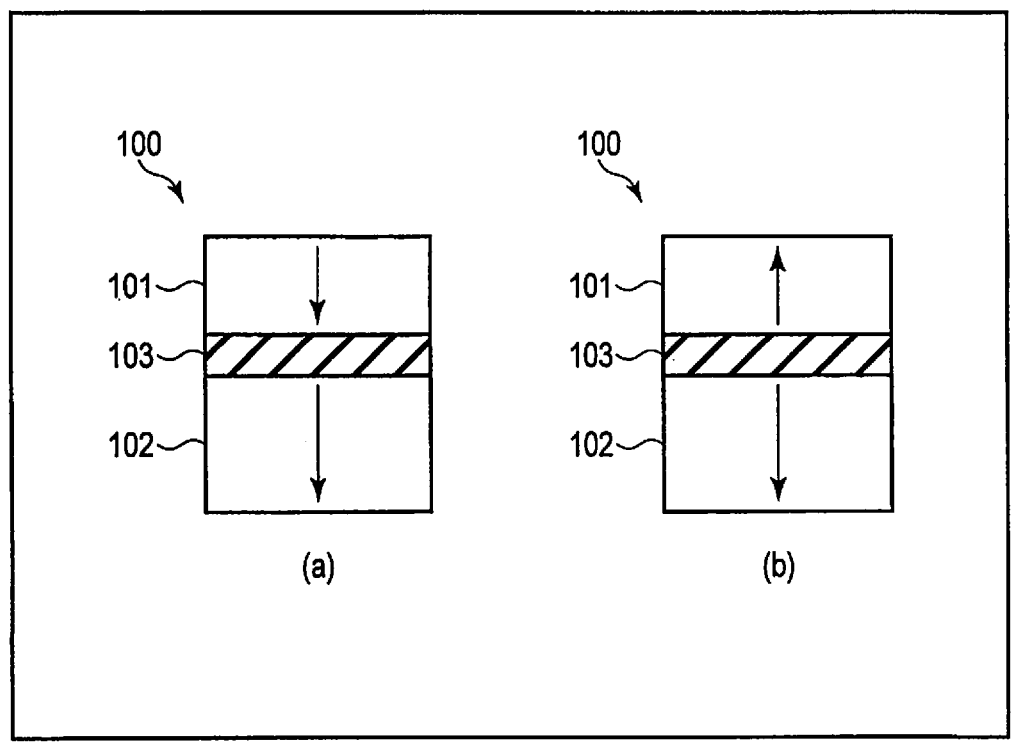
FIG. 6 is a view for explaining the memory element of the magnetic memory according to the first embodiment.

FIG. 6 is a schematic view for explaining the relationship between the magnetization alignment of the MTJ element and the resistance state of the MTJ element. In FIG. 6, the shift cancel layer of the MTJ element 100 is not illustrated.

As shown in (a) of FIG. 6, when the direction of magnetization of the storage layer 101 is the same as the direction of magnetization of the reference layer 102, the MTJ element 100 has a first resistance state (first magnetization alignment state).

As shown in (b) of FIG. 6, when the direction of magnetization of the storage layer 101 is opposite to the direction of magnetization of the reference layer 102, the MTJ element 100 has a second resistance state (second magnetization alignment state).

In general, a resistance value Rap of the MTJ element 100 having the second resistance state is higher than a resistance value Rp of the MTJ element 100 having the first resistance state.

In this way, the MTJ element 100 can have one of a low resistance state and a high resistance state in accordance with the magnetization alignment of the two magnetic layers 101 and 102.

For example, the MTJ element 100 holds 1-bit data ("0" data and "1" data). In this case, when the resistance state of the MTJ element 100 is set to the first resistance state, the memory cell MC is set in a first data holding state (for example, a "0" data holding state). When the resistance state of the MTJ element 100 is set to the second resistance state, the memory cell MC is set in a second data holding state (for example, a "1" data holding state).

In this embodiment, a magnetization alignment state in which the direction of magnetization of the storage layer 101 and the direction of magnetization of the reference layer 102 in the MTJ element 100 are the same is called a P state (or parallel state). A magnetization alignment state in which the direction of magnetization of the storage layer 101 and the direction of magnetization of the reference layer 102 in the MTJ element 100 are opposite to each other is also called an AP state (antiparallel state).

<Configuration Example of Read Circuit>

A configuration example of the read circuit in the MRAM according to this embodiment will be described with reference to FIGS. 7 and 8.

[Configuration]

An example of the configuration of the read circuit in the MRAM according to this embodiment will be described with reference to FIG. 7.

FIG. 7 is a schematic view for explaining the basic configuration of the read circuit in the MRAM according to this embodiment.

As shown in FIG. 7, the read circuit of the MRAM according to this embodiment includes the sense amplifier circuit 400, the reference cell array 149, and adjustment circuits 409 and 409z.

The memory cell array 10 is electrically connected to one input terminal of the sense amplifier circuit 400 via the column selection circuit 111.

The reference cell array 149 is electrically connected to the other input terminal of the sense amplifier circuit 400.

The adjustment circuit 409 is connected between the reference cell array 149 and the sense amplifier circuit 400. The adjustment circuit 409z is connected between the column selection circuit 111 and the sense amplifier circuit 400. Note that the adjustment circuit 409z on the side of the memory cell array 10 may be omitted in accordance with the circuit configuration of the read circuit (read section).

At the time of a read operation, the voltage (to be referred to as a read voltage hereinafter) VRD is applied to a memory cell (to be referred to as a selected cell hereinafter) corresponding to a selected address in the memory cell array 10. The voltage (to be referred to as a reference voltage hereinafter) VREF is applied to the reference cell array 149.

For example, a voltage Vz is applied to the sense amplifier circuit 400 as a driving voltage. The voltage value of the voltage Vz may be the same as the voltage value of the read voltage VRD. Depending on the configuration of the read circuit 14, the read voltage VRD is sometimes applied from the sense amplifier circuit 400 to a selected cell MCk.

FIG. 8 is a schematic view for explaining a configuration example of the reference cell array in the read circuit of the MRAM according to this embodiment.

As shown in FIG. 8, the reference cell array 149 includes a plurality of reference cell strings 300. The plurality of reference cell strings 300 are connected in parallel.

Each reference cell string 300 includes a plurality of MTJ elements 100A and 100B (to be also referred to as reference MTJ elements hereinafter). The MTJ element 100A is an MTJ element in the AP state, and the MTJ element 100B is an MTJ element in the P state. The MTJ elements 100A and 100B in the reference cell array 149 have substantially the same structure as the MTJ element 100 in the memory cell array 10. Note that in FIG. 8, the shift cancel layer in each of the MTJ elements 100A and 100B is not illustrated.

In the reference cell string 300, the MTJ element 100A in the AP state and the MTJ element 100B in the P state are connected in series. In the reference cell string 300, the MTJ element 100A in the AP state and the MTJ element 100B in the P state are alternately arranged.

In this way, the plurality of MTJ elements 100A and 100B are arranged in an array in the reference cell array 149.

The reference cell array 149 has a resistance value between a resistance value Rap of the MTJ element in the AP state and a resistance value Rp of the MTJ element in the P state.

(1b) Operation Mechanism

The mechanism of the operation of the MRAM according to the first embodiment will be described with reference to FIGS. 9 and 10.

<Mechanism of Write Operation>

The mechanism of the write operation of the MRAM according to this embodiment will be described.

For example, data writing to the MTJ element 100 is executed by applying a spin torque to the magnetization of the storage layer. By the spin torque, the magnetization of the storage layer is switched.

For example, in an STT (Spin Torque Transfer) type MRAM, a write current having a current value equal to or more than a magnetization switching threshold value is supplied to the MTJ element 100. Accordingly, a spin torque that causes magnetization switching in the storage layer is applied to the storage layer.

When changing the magnetization alignment state of the MTJ element 100 from the AP state to the P state, a spin torque of a spin (electrons) in the same direction as the direction of magnetization of the reference layer 102 is applied to the magnetization of the storage layer 101. If the direction of magnetization of the storage layer 101 is opposite to the direction of magnetization of the reference layer 102, the direction of magnetization of the storage layer 101 is changed to the same direction as the direction of magnetization of the reference layer 102 by the applied spin torque.

As a result, the magnetization alignment of the MTJ element 100 is set in the P state. In this way, "0" data is written to the memory cell MC.

Note that if a spin in the same direction as the direction of magnetization of the reference layer is applied to the storage layer of the MTJ element 100 in the P state, the direction of magnetization of the storage layer 101 does not change. For this reason, the MTJ element 100 maintains the P state.

When changing the magnetization alignment state of the MTJ element 100 from the P state to the AP state, a spin torque of a spin in the direction opposite to the direction of magnetization of the reference layer 102 is applied to the magnetization of the storage layer 101. If the direction of magnetization of the storage layer 101 is the same as the direction of magnetization of the reference layer 102, the direction of magnetization of the storage layer 101 is changed to the direction opposite to the direction of magnetization of the reference layer 102 by the applied spin torque.

As a result, the magnetization alignment of the MTJ element 100 is set in the AP state. In this way, "1" data is written to the memory cell MC.

Note that if a spin in the direction opposite to the direction of magnetization of the reference layer is applied to the storage layer of the MTJ element 100 in the AP state, the direction of magnetization of the storage layer 101 does not change. For this reason, the MTJ element 100 maintains the AP state.

Note that by applying energy (for example, a voltage and/or a spin current) equal to or more than the magnetization switching threshold value to the MTJ element, precession of magnetization of the storage layer may be excited, and the magnetization switching in the storage layer may be controlled.

<Mechanism of Read Operation>

The mechanism of the read operation of the MRAM according to this embodiment will be described with reference to FIGS. 9 and 10.

Data reading from the MTJ element 100 is executed using a signal (to be referred to as a cell signal hereinafter) output from the selected cell.

At the time of data reading (discrimination of the resistance state of the MTJ element 100), a read current (to be also referred to as a cell current hereinafter) IRD flows in the selected cell MCk (MTJ element 100). The current value of the read current IRD is smaller than the magnetization switching threshold value of the storage layer 101.

Data reading is executed based on the sense result of the cell signal such as the current value of the read current IRD, a variation in the potential of a certain node caused by the read current IRD, or a charge accumulation amount by the read current IRD.

For example, the current value of the read current IRD output from the MTJ element 100 in the high resistance state (AP state) is smaller than the current value of the read current IRD output from the MTJ element 100 in the low resistance state (P state).

Data held by the MTJ element 100 is discriminated based on such a variation in the read current IRD depending on the difference in the resistance state of the MTJ element 100.

As the determination criterion of the data (the magnitude of the cell signal) held by the MTJ element 100, a reference signal is used. The reference signal is generated using the signal from the above-described reference cell array 149.

FIG. 9 is a graph showing the relationship between the resistance value of an MTJ element and the probability density of the resistance value in a plurality of MTJ elements.

Referring to FIG. 9, the abscissa of the graph corresponds to the resistance value of the MTJ element, and the ordinate of the graph corresponds to the probability density (existence probability) of each resistance value.

As shown in FIG. 9, in the MRAM, a distribution 80 of the resistance value Rp of the MTJ element in the P state and a distribution 81 of the resistance value Rap of the MTJ element in the AP state each have a certain spread in accordance with the variation in the characteristic of the MTJ element. For example, the spread of each of the distributions 80 and 81 tends to increase along with the scaling of the MTJ elements.

A reference resistance value (reference value) Rref is set between the distribution 80 of the resistance value Rp and the distribution 81 of the resistance value Rap. In the read operation of the MRAM, data held by the MTJ element is discriminated based on the result of comparison between the cell signal (read signal) of the selected cell and the reference signal based on the reference resistance value.

The reliability of the data reading is improved by increasing the interval between the reference resistance value Rref and the distribution 80 and the interval between the reference value Rref and the distribution 81.

For example, the reference resistance value Rref is generated using the plurality of MTJ elements 100A and 100B in the reference cell array 149. The MTJ elements 100A and 100B in the reference cell array 149 have a characteristic variation, like the MTJ elements 100 in the memory cell array 10.

For this reason, the reference resistance value also has a distribution 87 with a certain spread. However, the distribution 87 of the reference resistance value Rref is narrower than the distribution 80 of the resistance value Rp and the distribution 81 of the resistance value Rap.

In the reference cell array 149, a failure that the magnetizations of the MTJ elements 100A and 100B are unintentionally switched by, for example, a retention error and/or a read disturb may occur. In this case, the reference resistance value varies.

For example, when the magnetization alignment of the MTJ element 100B in the reference cell array 149 changes from the P state to the AP state, the distribution of the reference resistance value Rref shifts from the predetermined distribution 87 to the side of the distribution 81 of the resistance value Rap, like a distribution 88 shown in FIG. 9. For this reason, the interval between the distribution 88 and the distribution 81 becomes narrower as compared to the interval between the distribution 87 and the distribution 81. For this reason, the reliability of read of "1" data deteriorates.

For example, when the magnetization alignment of the MTJ element 100A in the reference cell array 149 changes from the AP state to the P state, the distribution of the reference resistance value shifts from the predetermined distribution 87 to the side of the distribution 80 of the resistance value Rp, like a distribution 89 shown in FIG. 9. For this reason, the interval between the distribution 89 and the distribution 80 becomes narrower as compared to the interval between the distribution 87 and the distribution 80. For this reason, the reliability of read of "0" data deteriorates.

The reliability of data reading may deteriorate due to the shift of the distribution of the reference resistance value by the unintended magnetization switching (magnetization switching error) of the MTJ element in the reference cell array 149.

The MRAM according to this embodiment executes the read operation with high reliability using the voltage dependence of the MTJ element in the following way.

The voltage dependence characteristic of the resistance value in the magnetoresistive effect element will be described with reference to FIG. 10.

FIG. 10 is a graph showing the relationship between the applied voltage to the magnetoresistive effect element (MTJ element) and the resistance value of the magnetoresistive effect element. Referring to FIG. 10, the abscissa of the graph corresponds to the applied voltage, and the ordinate of the graph corresponds to the resistance value of the MTJ element.

In FIG. 10, a line A1 represents the relationship (voltage dependence characteristic) between the applied voltage and the resistance value of the MTJ element in the P state, and a line A2 represents the relationship between the applied voltage and the resistance value of the MTJ element in the AP state.

As the tendency of the relationship between the resistance value and the applied voltage of the MTJ element, when the applied voltage increases, the resistance value of the MTJ element 100 decreases. Note that if dielectric breakdown or magnetization switching by the application of a voltage to the MTJ element does not occur, the set magnetization alignment of the MTJ element is maintained even if the resistance value of the MTJ element decreases due to the increase in the voltage value of the applied voltage.

As shown in FIG. 10, the voltage dependence characteristic (line A1) of the resistance value of the MTJ element in the P state is different from the voltage dependence characteristic (line A2) of the resistance value of the MTJ element in the AP state.

As indicated by the line A1, even if the applied voltage increases from 0 V to a voltage value V2, a change in the resistance value of the MTJ element in the P state hardly occurs (or is small).

To the contrary, as indicated by the line A2, within the range of the applied voltage from a voltage value of 0 V to the voltage value V2, the change amount of the resistance value of the MTJ element in the AP state is larger than the change amount of the resistance value of the MTJ element in the P state.

When the applied voltage has a voltage value V1, the MTJ element in the AP state has a resistance value R1. When the applied voltage has the voltage value V2, the MTJ element in the AP state has a resistance value R2 smaller than the resistance value R1. For example, the resistance value R2 has a value close to the resistance value Rp of the MTJ element in the P state.

At the voltage value V1, the difference (resistance difference) between the resistance value R1 of the MTJ element in the AP state and the resistance value Rp of the MTJ element in the P state is "D1". At the voltage value V2, the difference between the resistance value R2 of the MTJ element in the AP state and the resistance value Rp of the MTJ element in the P state is "D2". The resistance difference D1 is larger than the resistance difference D2.

As described above, the resistance value of the MTJ element in a case in which a certain voltage is applied to the MTJ element and the change amount of the resistance value of the MTJ element with respect to the applied voltage change depending on the magnetization alignment state of the MTJ element.

In the MRAM according to this embodiment, the voltage value of the reference voltage VREF is different from the voltage value of the read voltage VRD.

At the time of the read operation, the MRAM according to this embodiment applies the read voltage VRD to the selected cell MCk to generate the cell signal (for example, the read current IRD), and applies the reference voltage VREF to the reference cell array 149 to generate the reference signal (for example, a reference current IREF).

Concerning data reading from the selected cell (MTJ element), to ensure high reliability of data reading, the difference between the resistance value Rap of the MTJ element in the AP state and the resistance value Rp of the MTJ element in the P state is preferably large.

For this reason, a voltage having a relatively small voltage value (for example, the voltage value V1) is preferably applied to the selected cell as the read voltage VRD.

Concerning generation of the reference signal in the reference cell array, the influence of the change in the resistance value caused by magnetization switching is preferably small from the viewpoint of a switching error of the MTJ element. For example, when the magnetization alignment of the reference MTJ element changes from the AP state to the P state (or from the P state to the AP state) due to the magnetization switching error, the change amount D2 of the resistance value at the time of application of the voltage value V2 is smaller than the change amount D1 of the resistance value at the time of application of the voltage value V1.

For this reason, a voltage having a relatively large voltage value (for example, the voltage value V2) is preferably applied to the reference cell array as the reference voltage VREF.

Hence, in the MRAM according to this embodiment, the voltage value (absolute value) of the reference voltage VREF is larger than the voltage value (absolute value) of the read voltage VRD.

Accordingly, in the MRAM according to this embodiment, a large interval can be ensured between the distribution 80 of the resistance value Rp and the distribution 81 of the resistance value Rap at the time of the read operation.

Additionally, in the MRAM according to this embodiment, even if the magnetization switching error of the reference MTJ element occurs, the shift amount of the distribution 87 of the reference resistance value (reference signal) to the high resistance side or the low resistance side becomes small.

In this embodiment, to adjust the signal amount (current amount) derived from the difference between the read voltage VRD and the reference voltage VREF, the adjustment circuit 409 (409z) is provided in the read circuit 14 (each read section 140).

In the example shown in FIG. 7, the adjustment circuit 409 is connected between the reference cell array 149 and the second input terminal of the sense amplifier circuit 400.

The adjustment circuit 409z is connected between the selected cell (memory cell array) and the first input terminal of the sense amplifier circuit 400.

The adjustment circuit 409 can convert (adjust) the signal value (signal amount) of a signal from the reference cell array 149 to which the reference voltage VREF is applied from a signal value based on the reference voltage VREF to a signal value based on the read voltage VRD. For example, the adjustment circuit 409 can compensate for the difference between the current value of the reference current and the current value of the read current generated by the difference between the voltage value of the read voltage VRD and the voltage value of the reference voltage VREF.

The adjustment circuit 409 adjusts the current values of the currents IREF and IRD such that the current value of the reference current IREF becomes a value near the intermediate point between the current value of the current flowing to the MTJ element in the P state at the time of application of the read voltage VRD and the current value of the current flowing to the MTJ element in the AP state at the time of application of the read voltage VRD.

Note that in some cases, the adjustment circuit 409 is not connected between the memory cell array 10 and the sense amplifier circuit 400 depending on the circuit configuration.

(1c) Detailed Example

A detailed example of the MRAM according to this embodiment will be described with reference to FIGS. 11, 12, and 13.

<Circuit Configuration>

Figure 11:
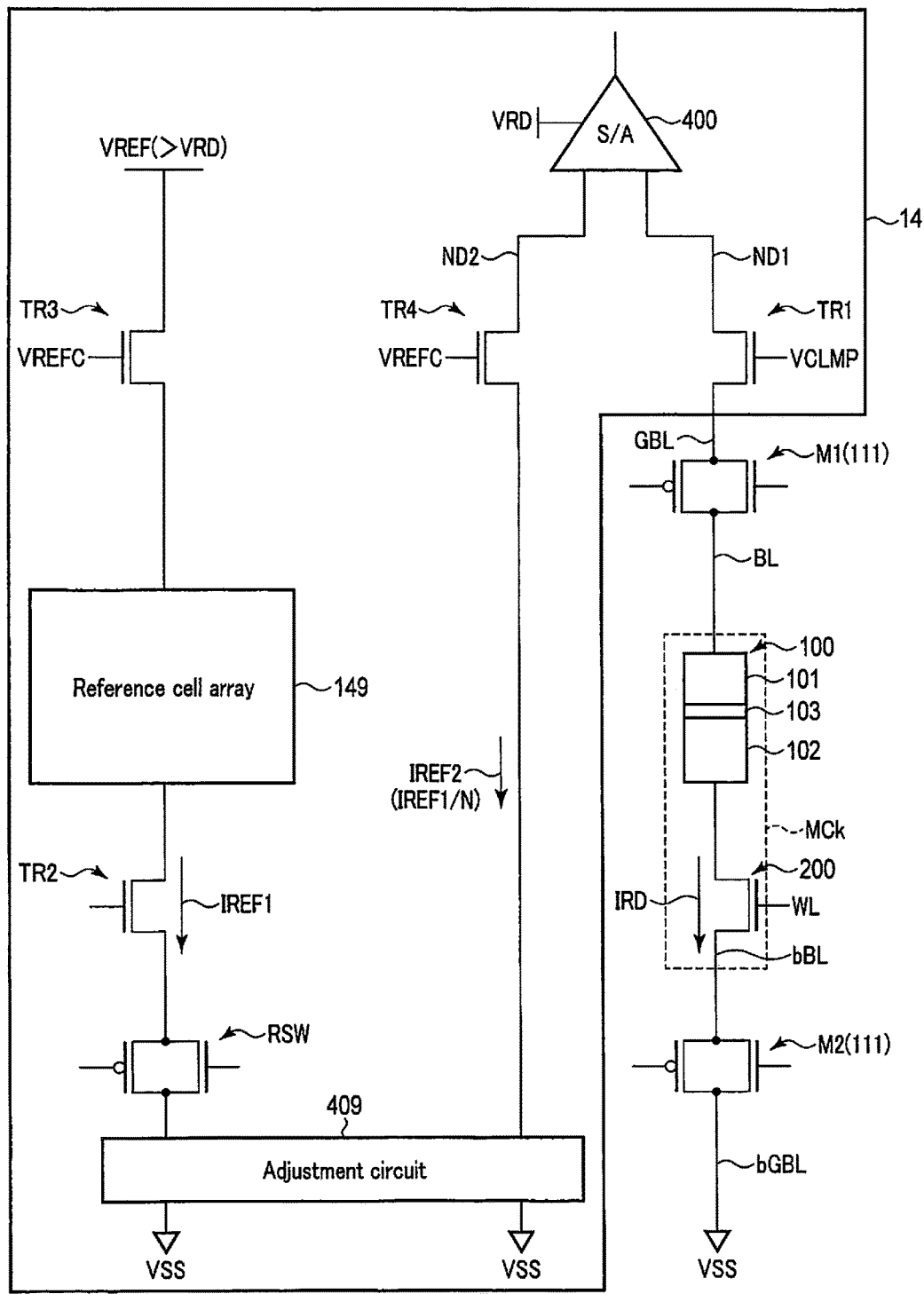

FIG. 11 is a schematic view for explaining the configuration example of the MRAM according to this embodiment in more detail.

As shown in FIG. 11, the read circuit 14 (read section 140) includes the sense amplifier circuit 400, the adjustment circuit 409, and the reference cell array 149.

At the time of the read operation, the selected cell MCk is connected to the sense amplifier circuit 400.

In the column selection circuits 111, the switches M1 and M2 are set in the ON state based on a selected address. One terminal (the terminal on the side of the bit line BL) of the selected cell MCk is connected to a first input terminal ND1 of the sense amplifier circuit 400 via the switch M1 in the ON state. The other terminal (the terminal on the side of the source line bBL) of the selected cell MCk is connected, via the switch M2 in the ON state, to a terminal (to be referred to as a ground terminal VSS hereinafter) to which a ground voltage VSS is applied.

An n-type transistor TR1 is connected between the switch M1 and the sense amplifier circuit 400. A gate voltage VCLMP is applied to the gate of the transistor TR1. The transistor TR1 is a transistor configured to clamp the potential of the bit line BL. The transistor TR1 will be referred to as a clamp transistor hereinafter.

The clamp transistor TR1 controls the potential of the bit line BL and the current amount of the read current IRD by the gate voltage (clamp voltage) VCLMP.

One terminal of the reference cell array 149 is connected to the adjustment circuit 409 via an n-type transistor (select transistor) TR2 and a switch RSW. The other terminal of the reference cell array 149 is connected, via an n-type transistor TR3, to a terminal (to be referred to as a voltage terminal VREF hereinafter) to which the reference voltage VREF is applied.

A gate voltage VREFC is applied to the gate of the transistor TR3. The transistor TR3 is a clamp transistor. The transistor TR3 controls the current amount of a current IREF1 by the clamp voltage (gate voltage) VREFC.

The adjustment circuit 409 is connected to a second input terminal ND2 of the sense amplifier circuit 400 via an n-type transistor TR4. The adjustment circuit 409 is connected to the ground terminal VSS.

The transistor TR4 is a clamp transistor. The clamp voltage VREFC is applied to the gate of the transistor TR4. The clamp transistor TR4 controls the current amount of a current IREF2 by the clamp voltage VREFC.

In the example shown in FIG. 11, the read voltage VRD is applied from the sense amplifier circuit 400 to the selected cell MCk. At the time of the read operation, the read current (cell current) IRD according to the read voltage VRD flows in the selected cell MCk and to the node ND1 of the sense amplifier circuit 400.

The magnitude (current value) of the read current IRD complies with the resistance value of the MTJ element 100 of the selected cell MCk at the time of application of the read voltage VRD.

The reference current IREF1 flows in the reference cell array 149. The magnitude of the reference current IREF1 complies with the resistance value (combined resistance) of the reference cell array 149 at the time of application of the reference voltage VREF.

The reference current IREF1 is supplied to the adjustment circuit 409.

The adjustment circuit 409 adjusts (compensates for or converts) the current value of the reference current IREF1. The adjustment circuit 409 supplies the adjusted current (to be also referred to as a reference current or an adjustment reference current hereinafter) IREF2 to the sense amplifier circuit 400.

FIG. 12 is an equivalent circuit diagram showing an example of the internal configuration of the sense amplifier circuit in the read circuit of the MRAM according to this embodiment.

The sense amplifier circuit of the example shown in FIG. 12 includes four n-type transistors XN1, XN2, XN3, and XN4 and four p-type transistors XP1, XP2, XP3, and XP4.

One end (one of the source/drains) of the current path of the transistor XN1 is connected to the node (first input terminal) ND1. The other end (the other of the source/drains) of the current path of the transistor XN1 is connected to a node ND3. The gate of the transistor XN1 is connected to a node ND4.

One end of the current path of the transistor XN2 is connected to the ground terminal VSS. The other end of the current path of the transistor XN2 is connected to the node ND1. A control signal SEN2 is supplied to the gate of the transistor XN2.

One end of the current path of the transistor XP1 is connected to the voltage terminal VRD. The other end of the current path of the transistor XP1 is connected to the node ND3. The gate of the transistor XP1 is connected to the node ND4 and the gate of the transistor XN1.

The current path of the transistor XP2 is connected in parallel with the current path of the transistor XP1. One end of the current path of the transistor XP2 is connected to the voltage terminal VRD. The other end of the current path of the transistor XP2 is connected to the node ND3. A control signal SEN1 is supplied to the gate of the transistor XP2.

One end of the current path of the transistor XN3 is connected to the node (second input terminal) ND2. The other end of the current path of the transistor XN3 is connected to the node ND4. The gate of the transistor XN3 is connected to the node ND3.

One end of the current path of the transistor XN4 is connected to the ground terminal VSS. The other end of the current path of the transistor XN4 is connected to the node ND2. The control signal SEN2 is supplied to the gate of the transistor XN4.

One end of the current path of the transistor XP3 is connected to the voltage terminal VRD. The other end of the current path of the transistor XP3 is connected to the node ND4. The gate of the transistor XP3 is connected to the node ND3 and the gate of the transistor XN3.

The current path of the transistor XP4 is connected in parallel with the current path of the transistor XP3. One end of the current path of the transistor XP4 is connected to the voltage terminal VRD. The other end of the current path of the transistor XP4 is connected to the node ND4. The control signal SEN1 is supplied to the gate of the transistor XP4.

The sense amplifier circuit 400 is activated by controlling the signal levels of the control signals SEN1 and SEN2.

An output terminal DOUT is connected to the node ND3. An output terminal bDOUT is connected to the node ND4. A signal corresponding to the data held by the selected cell MCk is output from the output terminal DOUT. A signal corresponding to the inverted data of the data held by the selected cell MCk is output from the output terminal bDOUT.

FIG. 13 is an equivalent circuit diagram showing an example of the internal configuration of the adjustment circuit in the read circuit of the MRAM according to this embodiment.

For example, the adjustment circuit (also called a current conversion circuit or a current division circuit) 409 is a current mirror circuit.

As shown in FIG. 13, the adjustment circuit 409 includes two n-type transistors Q1 and Q2.

One end of the current path of the transistor Q1 is connected to a node NDA. The other end of the current path of the transistor Q1 is connected to the ground terminal VSS. The gate of the transistor Q1 is connected to the node NDA.

One end of the current path of the transistor Q2 is connected to a node NDB. The other end of the current path of the transistor Q2 is connected to the ground terminal VSS. The gate of the transistor Q2 is connected to the node NDA and the gate of the transistor Q1.

The node NDA is connected to the reference cell array 149. The node NDB is connected to the second input terminal ND2 of the sense amplifier circuit 400.

The gate size of the transistor Q1 is larger than the gate size of the transistor Q2.

For example, the gate width of the transistor Q1 is set to be N times larger than a gate width W of the transistor Q2.

As a result, the current value of the current IREF2 (=IREF1/N) flowing to the transistor Q2 is 1/N of the current value of the current IREF1 flowing to the transistor Q1.

For example, the value "N" may be set based on the MTJ elements 100A and 100B in the reference cell array 149 as follows.

The reference cell array 149 includes a×b reference MTJ elements 100A and 100B. In the reference cell array 149, "b" reference cell strings 300 are provided. Each reference cell string 300 includes "a" reference MTJ elements 100A and 100B.

Of the a reference MTJ elements in one reference cell string 300, "c" MTJ elements are the MTJ elements 100B in the P state, and "d" (=a−c) MTJ elements are the MTJ elements 100A in the AP state.

When a reference voltage $V_{ref}$ is applied to the reference cell array 149, a voltage (voltage value) $V_{ref,P}$ given by a following equation (B1):

$$V_{ref,P} = \frac{R_P}{cR_P + dR_{AP}} V_{ref} \quad (B1)$$

is applied to the MTJ elements in the P state in the reference cell array 149.

In equation (B1), "$R_P$" is the resistance value of the MTJ element in the P state, and "$R_{AP}$" is the resistance value of the MTJ element in the AP state.

At this time, the resistance value $R_{AP}$ of the MTJ element in the AP state is given by a following equation (B2):

$$R_{AP} = R_P \left(1 + MR_0 \left(1 - \frac{V_{ref,AP}}{2V_{half}}\right)\right) \quad (B2)$$

where "$MR_0$" is the MR ratio at the time of application of a voltage of 0 V to the MTJ element, "$V_{half}$" is a voltage (voltage value) that changes the MR ratio of the MTJ element to ½ of "$MR_0$", and "$V_{ref,AP}$" is a voltage (voltage value) applied to the MTJ element in the AP state in the reference cell array 149.

Using equation (B2), equation (B1) can be expressed as a following equation (B3):

$$V_{ref,P} = \frac{R_P}{cR_P + dR_P\left(1 + MR_0\left(1 - \frac{V_{ref,AP}}{2V_{half}}\right)\right)} V_{ref} \quad (B3)$$

$$= \frac{1}{c + d\left(1 + MR_0\left(1 - \frac{V_{ref} - V_{ref,P}}{2V_{half}}\right)\right)} V_{ref}$$

Accordingly, the voltage $V_{ref,P}$ is given by a following equation (B4):

$$V_{ref,P} = \frac{-\left(c + d\left(1 + MR_0\left(1 - \frac{V_{ref}}{2V_{half}}\right)\right)\right) + \sqrt{\left(c + d\left(1 + MR_0\left(1 - \frac{V_{ref}}{2V_{half}}\right)\right)\right)^2 - 4\frac{dMR_0}{2V_h}}}{dMR_0} V_h \quad (B4)$$

Here, since $V_{ref,P} > 0$, the voltage $V_{ref,P}$ is given by a following equation (B5):

$$V_{ref,P} = \frac{-\left(c + d\left(1 + MR_0\left(1 - \frac{V_{ref}}{2V_{half}}\right)\right)\right) + \sqrt{\left(c + d\left(1 + MR_0\left(1 - \frac{V_{ref}}{2V_{half}}\right)\right)\right)^2 - 2\frac{dMR_0}{V_{half}}}}{dMR_0} V_h \quad (B5)$$

The voltage $V_{ref,AP}$ applied to the MTJ element in the AP state in the reference cell array 149 has a relation given by $V_{ref,AP} = V_{ref} - V_{ref,P}$.

For this reason, the voltage $V_{ref,AP}$ is given by a following equation (B6):

$$V_{ref,AP} = V_{ref} - \frac{-\left(c + d\left(1 + MR_0\left(1 - \frac{V_{ref}}{2V_{half}}\right)\right)\right) + \sqrt{\left(c + d\left(1 + MR_0\left(1 - \frac{V_{ref}}{2V_{half}}\right)\right)\right)^2 - 2\frac{dMR_0}{V_{half}}}}{dMR_0} V_h \quad (B6)$$

The resistance value (combined resistance) $R_{ref}$ of the reference cell array 149 is given by a following equation (B7):

$$R_{ref} = \frac{cR_P + dR_{AP}}{b} = \frac{R_P}{b}\left(c + \left(1 + MR_0\left(1 - \frac{V_{ref,AP}}{2V_{half}}\right)\right)\right) \quad (B7)$$

The current IREF1 flowing in the reference cell array 149 is represented by a following equation (B8):

$$\frac{V_{ref}}{R_{ref}} \quad (B8)$$

A current $I_{ref}$ (=IREF2) adjusted to 1/N of the reference current (IREF1) is supplied to the second input terminal of the sense amplifier circuit 400.

The current $I_{ref}$ is given by a following equation (B9):

$$I_{ref} = \frac{V_{ref}}{NR_{ref}} \quad (B9)$$

A current value $I_P$ of the read current in a case in which the MTJ element in the selected cell is in the P state is given by a following equation (B10):

$$I_P = \frac{V_{read}}{R_P} \quad (B10)$$

Here, "$V_{read}$" in equation (10) represents a read voltage (VRD).

In addition, a current value $I_{AP}$ of the read current in a case in which the MTJ element in the selected cell is in the AP state is given by a following equation (B11):

$$I_{AP} = \frac{V_{read}}{R_{AP}} = \frac{V_{read}}{R_P}\left(\frac{1}{1 + MR_0\left(1 - \frac{V_{read}}{2V_{half}}\right)}\right) \quad (B11)$$

The current value of the reference current is set to a value between the current value of the current flowing to the MTJ element in the P state and the current value of the current flowing to the MTJ element in the AP state. Here, the current value of the reference current $I_{ref}$ is the average value of the current value of the current flowing to the MTJ element in the P state and the current value of the current flowing to the MTJ element in the AP state.

Hence, the reference current $I_{ref}$ can be expressed using equations (B10) and (B11) as a following equation (B12):

$$I_{ref} = \frac{I_P + I_{AP}}{2} = \frac{V_{read}}{2R_P}\left(\frac{2 + MR_0\left(1 - \frac{V_{read}}{2V_{half}}\right)}{1 + MR_0\left(1 - \frac{V_{read}}{2V_{half}}\right)}\right) \quad (B12)$$

In addition, using equations (B7) and (B12), the reference current $I_{ref}$ holds a relation given by a following equation (B13):

$$\frac{V_{ref}}{\frac{R_P}{b}\left(c + \left(1 + MR_0\left(1 - \frac{V_{ref,AP}}{2V_{half}}\right)\right)\right)N} = \frac{V_{read}}{2R_P}\left(\frac{2 + MR_0\left(1 - \frac{V_{read}}{2V_{half}}\right)}{1 + MR_0\left(1 - \frac{V_{read}}{2V_{half}}\right)}\right) \quad (B13)$$

Accordingly, the value of a current conversion ratio N of the adjustment circuit (for example, the ratio of the gate widths of the transistors of the current mirror circuit) is preferably set based on a following equation (B14):

$$N = \frac{2bV_{ref}\left(1 + MR_0\left(1 - \frac{V_{read}}{2V_{half}}\right)\right)}{V_{read}\left(c + \left(1 + MR_0\left(1 - \frac{V_{ref,AP}}{2V_{half}}\right)\right)\right)\left(2 + MR_0\left(1 - \frac{V_{read}}{2V_{half}}\right)\right)} \quad (B14)$$

Operation Example

For example, in the MRAM according to this embodiment, a read operation using the current sense type sense amplifier circuit is executed as follows. Here, FIGS. 1, 2, 3, 4, 5, 6, 7, 8, 9, 10, 11, 12, and 13 described above will be referred to as needed.

When the external device (the host device 9 or the processor 7) reads data from the MRAM 1, the external device transmits a read command, a selected address, and various kinds of control signals to the MRAM 1 according to this embodiment.

In the MRAM 1 according to this embodiment, the control circuit 15 receives the read command CMD, the selected address ADR, and the control signal CNT via the I/O circuit 150.

The control circuit 15 starts the read operation based on the read command CMD.

The control circuit 15 controls the operations of the circuits in the MRAM 1 to execute the read operation.

The decoding circuit 151 decodes the selected address ADR. The decoding result of the selected address ADR is transmitted to the column control circuit 11 and the row control circuit 12.

The row control circuit 12 activates at least one word line WL of the plurality of word lines based on the decoding result of the selected address ADR.

The column control circuit 11 activates at least one bit line pair (the bit line BL and the source line bBL) of the plurality of bit lines based on the decoding result of the selected address ADR. For example, the column selection circuit 111 sets the switches (column selection switches) M1 and M2 corresponding to the decoding result of the selected address ADR in the ON state. The memory cell MCk corresponding to the selected address ADR is thus selected.

The control circuit 15 sets the transistor TR2 and the switch RSW in the ON state. This activates the reference cell array 149.

The clamp voltage VCLMP is applied to the gate of the clamp transistor TR1. The clamp voltage VREFC is applied to the gates of the clamp transistors TR3 and TR4.

The reference voltage VREF is applied to the reference cell array 149. The reference cell array 149 outputs the reference current IREF1 by the application of the reference voltage VREF.

The read circuit 14 (at least one read section 140) is activated by the control circuit 15. The sense amplifier circuit 400 is electrically connected to the selected cell MCk and the reference cell array 149.

In the current sense type sense amplifier circuit 400 shown in FIG. 12, as the initial state of the operation, the signal levels of the control signals SEN1 and SEN2 are set to "L (low)" level by the control circuit 15.

In this state, the transistors XP2 and XP4 are in the ON state, and the transistors XN2 and XN4 are in the OFF state.

A current that has passed through the transistor XP2 flows to the ground terminal VSS via the nodes ND3 and ND1 and the selected cell MCk. A current that has passed through the transistor XP4 flows to the ground terminal VSS via the nodes ND4 and ND2 and the adjustment circuit 409.

The operation of the sense amplifier circuit in a case in which the current value of the read current IRD is smaller than the current value of the reference current (adjustment reference current) IREF2 will be described. In this case, the MTJ element 100 of the selected cell MCk is in the AP state.

In this case, since the current flowing in the transistor XP2 is smaller than the current flowing in the transistor XP4, the potential of the node ND3 becomes higher than the potential of the node ND4.

The control signal SEN1 is set to "H (high)" level, and the transistors XP2 and XP4 are set in the OFF state. At this time, since the potential of the node ND3 is higher than the potential of the node ND4, the conductance of the transistor XN3 becomes larger than the conductance of the transistor XN1, and the conductance of the transistor XP3 becomes smaller than the conductance of the transistor XP1. For this reason, the potential of the node ND3 rises, and the potential of the node ND4 lowers.

Next, the control signal SEN2 is set to "H" level, and the transistors XN2 and XN4 are set in the ON state. Then, the potentials of the nodes ND1 and ND2 are discharged to the ground terminal VSS. At this time, since the potential of the node ND3 is higher than the potential of the node ND4, the conductance of the transistor XN3 further becomes larger than the conductance of the transistor XN1, and the conductance of the transistor XP3 further becomes smaller than the conductance of the transistor XP1. For this reason, the potential of the node ND3 rises, and the potential of the node ND4 lowers.

Such changes in the potentials of the nodes ND3 and ND4 continue until the potential of the node ND3 becomes the voltage VRD, and the potential of the node ND4 becomes the ground voltage VSS.

As a result, the potential of the node ND3 is set to "H" level, and the potential of the node ND4 is set to "L" level. In this case, a signal of "H" level is output from the output terminal DOUT. Accordingly, "1" data is read from the selected cell MCk in correspondence with the signal of level. Note that a signal of "L" level (here, "0" data) is output from the output terminal bDOUT.

The operation of the sense amplifier circuit in a case in which the current value of the read current IRD is equal to or more than the current value of the reference current (adjustment reference current) IREF2 will be described. In this case, the MTJ element of the selected cell MCk is in the P state.

In this case, since the current flowing in the transistor XP2 is larger than the current flowing in the transistor XP4, the potential of the node ND3 becomes lower than the potential of the node ND4.

The transistors XP2 and XP4 are set in the OFF state by the control signal SEN1 of "H" level. At this time, since the potential of the node ND4 is higher than the potential of the node ND3, the conductance of the transistor XN1 becomes larger than the conductance of the transistor XN3, and the conductance of the transistor XP1 becomes smaller than the conductance of the transistor XP3. For this reason, the potential of the node ND4 rises, and the potential of the node ND3 lowers.

The transistors XN2 and XN4 are set in the ON state by the control signal SEN2 of "H" level. Accordingly, the potentials of the nodes ND1 and ND2 are discharged to the ground terminal VSS. At this time, since the potential of the node ND4 is higher than the potential of the node ND3, the conductance of the transistor XN1 further becomes larger than the conductance of the transistor XN3, and the conductance of the transistor XP1 further becomes smaller than the conductance of the transistor XP3. For this reason, the potential of the node ND4 further rises, and the potential of the node ND3 further lowers.

Such changes in the potentials of the nodes ND3 and ND4 continue until the potential of the node ND4 becomes the voltage VRD, and the potential of the node ND3 becomes the ground voltage VSS.

As a result, the potential of the node ND4 is set to "H" level, and the potential of the node ND3 is set to "L" level. In this case, a signal of "L" level is output from the output terminal DOUT. Accordingly, "0" data is read from the selected cell MCk in correspondence with the signal of "L" level. Note that a signal of "H" level (here, "1" data) is output from the output terminal bDOUT.

In this embodiment, the read voltage VRD lower than the reference voltage VREF is applied to the selected cell MCk. This ensures a relatively large difference between the resistance value of the MTJ element in the AP state and the resistance value of the MTJ element in the P state.

For this reason, in this embodiment, it is possible to ensure a relatively large read margin between the reference current IREF2 and the read current IRD of the MTJ element in the P state and between the reference current IREF2 and the read current IRD of the MTJ element in the AP state.

The signal output from the output terminal DOUT (node ND3) is transmitted as read data from the read circuit 14 to the control circuit 15.

The control circuit 15 transmits the read data to the external device via the I/O circuit 150.

The read operation of the MRAM according to this embodiment is completed by the above operation.

Note that the MRAM according to this embodiment can apply and execute a known write operation. Hence, a description of the write operation of the MRAM according to this embodiment will be omitted.

(1d) Summary

In the magnetic memory (for example, an MRAM) according to this embodiment, the voltage (voltage value) applied to the reference circuit (reference cell array) in the read operation is higher than the read voltage applied to the selected cell. The reference signal (reference current) from the reference circuit and the cell signal (read current) from the selected cell are generated by the two different voltages, respectively.

In this embodiment, the reference circuit includes a plurality of magnetoresistive effect elements in the parallel magnetization alignment state (P state) and a plurality of magnetoresistive effect elements in the antiparallel magnetization alignment state (AP state).

In this embodiment, a circuit configured to compensate for the voltage difference between the reference voltage and the read voltage is connected between the reference cell array and the sense amplifier circuit.

In the magnetic memory according to this embodiment, a relatively high reference voltage is applied to the reference circuit. Accordingly, in the magnetic memory according to this embodiment, the reference signal is generated in a state in which the difference between the resistance value of the magnetoresistive effect element in the P state and the resistance value of the magnetoresistive effect element in the AP state is reduced based on the voltage dependence of the resistance values of the magnetoresistive effect elements.

As a result, the magnetic memory according to this embodiment can reduce the adverse effect of the variation in the current value of the reference current caused by a magnetization switching error.

In the magnetic memory according to this embodiment, when the read voltage lower than the reference voltage is applied to the selected cell, it is possible to ensure a relatively large difference between the resistance value of the magnetoresistive effect element in the P state and the resistance value of the magnetoresistive effect element in the AP state.

As a result, the magnetic memory according to this embodiment can ensure a relatively large read margin.

Hence, the magnetic memory according to the first embodiment can improve the reliability of the operation.

(2) Second Embodiment

A magnetic memory according to the second embodiment will be described with reference to FIG. 14.

FIG. 14 is an equivalent circuit diagram for explaining an example of a magnetic memory (for example, an MRAM) according to this embodiment.

As shown in FIG. 14, an adjustment circuit 409 may be a cascode current mirror circuit 409.

The cascode current mirror circuit 409 includes four transistors Q1, Q2, Q3, and Q4.

The current path of the transistor Q3 is connected in series between a ground terminal VSS and the other end of the current path of the transistor Q1. The gate of the transistor Q3 is connected to the other end of the current path of the transistor Q1 and one end of the current path of the transistor Q3.

The current path of the transistor Q4 is connected in series between the ground terminal VSS and the other end of the current path of the transistor Q2. The gate of the transistor Q4 is connected to the gate of the transistor Q3 and one end of the current path of the transistor Q3.

The gate size of the transistor Q3 is the same as the gate size of the transistor Q1. For example, the gate width of the transistor Q3 is set to the same size as the gate width (N×W) of the transistor Q1.

The gate size of the transistor Q4 is the same as the gate size of the transistor Q2. For example, the gate width of the transistor Q4 is set to the same size as the gate width (W) of the transistor Q2.

In a case in which the cascode current mirror circuit is used as the adjustment circuit 409, as in this embodiment, even if the variation in the voltage input to the adjustment circuit 409 and/or the voltage output from the adjustment circuit 409 is large, the conversion ratio (adjustment amount) of the current of the adjustment circuit on the reference cell array side and the current on the sense amplifier side can be stabilized.

Hence, according to the magnetic memory of the second embodiment, it is possible to improve the reliability of the read operation.

(3) Third Embodiment

A magnetic memory according to the third embodiment will be described with reference to FIG. 15.

FIG. 15 is a schematic view for explaining the circuit configuration of a magnetic memory (for example, an MRAM) according to the third embodiment.

As shown in FIG. 15, an adjustment circuit 409z configured to adjust a read current may be provided on the memory cell array side (selected cell side).

A first input terminal ND1 of a sense amplifier circuit 400 is connected to the adjustment circuit 409z via a clamp transistor TR1B. A clamp voltage VCLMP is applied to the gate of the clamp transistor TR1B.

At the time of data reading, a selected cell MCk is connected to the adjustment circuit 409z via a switch M2 on the source line side. The selected cell MCk is connected to a voltage terminal VRD via a switch M1 on the bit line side and a clamp transistor TR1A.

The read voltage VRD is applied from the voltage terminal VRD to the selected cell MCk. By the applied read voltage VRD, a read current (cell current) IRD flows to the selected cell MCk.

A current (to be also referred to as a read current or an adjusted read current hereinafter) IRDz flows to the input terminal ND1 of the sense amplifier circuit 400. The current IRDz has a current value adjusted by an adjustment circuit 409. The current IRDz has a current value 1/M of a read current IRD.

The adjustment circuit 409z has substantially the same configuration as, for example, the current mirror circuit shown in FIG. 13.

For example, in the current mirror circuit shown in FIG. 13, a node NDA is connected to the selected cell MCk. A node NDB is connected to the first input terminal ND1 of the sense amplifier circuit 400.

In the adjustment circuit 409z, the gate width of the transistor connected to the sense amplifier circuit 400 is set to a size 1/M of a gate width W of the transistor connected to the selected cell MCk.

Note that the cascode current mirror circuit shown in FIG. 14 may be used as the adjustment circuit 409z.

In this embodiment, the sense amplifier circuit 400 compares an adjusted reference current IREF2 of the adjustment circuit 409 with the adjusted read current IRDz. The data of the selected cell MCk is thus discriminated.

As described above, the magnetic memory according to the third embodiment can obtain substantially the same effect as the magnetic memory according to the first embodiment.

(4) Fourth Embodiment

A magnetic memory according to the fourth embodiment will be described with reference to FIGS. 16 to 19.

(4a) Configuration Example

FIG. 16 is a schematic view for explaining the circuit configuration of a magnetic memory (for example, an MRAM) according to this embodiment.

As shown in FIG. 16, a sense amplifier circuit 400A may be provided on the low potential side of a selected cell.

The sense amplifier circuit 400A is connected to a selected cell MCk via a source line bBL. The selected cell MCk is connected to a first input terminal ND1 of the sense amplifier circuit 400A.

A reference cell array 149 is connected to the sense amplifier circuit 400A via an adjustment circuit 409A. One terminal of the reference cell array 149 is connected to the adjustment circuit 409A via a clamp transistor TR3. The other terminal of the reference cell array 149 is connected to a ground terminal VSS via a transistor TR2 and a switch RSW.

The adjustment circuit 409A is provided on the high potential side with respect to the sense amplifier circuit 400A.

The adjustment circuit 409A is connected to a second input terminal ND2 of the sense amplifier circuit 400A via a clamp transistor TR4.

A read voltage VRD is applied from the voltage terminal VRD to the selected cell MCk via a selected bit line BL. The selected cell MCk outputs a read current IRD to the source line bBL. The read current IRD is supplied to the first input terminal ND1 of the sense amplifier circuit 400A.

A reference voltage VREF is applied from the adjustment circuit 409A to the reference cell array 149. The reference cell array 149 outputs a reference current IREF1.

The adjustment circuit 409A outputs a current IREF2 (=IREF1/N) corresponding to the reference current IREF1. The current IREF2 is supplied to the second input terminal ND2 of the sense amplifier circuit 400A.

FIG. 17 is an equivalent circuit diagram showing an example of the internal configuration of the sense amplifier circuit in the read circuit of the MRAM according to this embodiment.

The sense amplifier circuit (for example, a current sense type sense amplifier circuit) 400A of the example shown in FIG. 17 includes four n-type transistors YN1, YN2, YN3, and YN4 and four p-type transistors YP1, YP2, YP3, and YP4.

One end (one of the source/drains) of the current path of the transistor YP1 is connected to the node ND1. The other end (the other of the source/drains) of the current path of the transistor YP1 is connected to a node (output terminal DOUT) ND3. The gate of the transistor YP1 is connected to a node (output terminal bDOUT) ND4.

One end of the current path of the transistor YP2 is connected to the voltage terminal VRD. The other end of the current path of the transistor YP2 is connected to the node ND1. A control signal SEN2 is supplied to the gate of the transistor YP2.

One end of the current path of the transistor YN1 is connected to the ground terminal VSS. The other end of the current path of the transistor YN1 is connected to the node ND3. The gate of the transistor YN1 is connected to the node ND4 and the gate of the transistor YP1.

The current path of the transistor YN2 is connected in parallel with the current path of the transistor YN1. One end of the current path of the transistor YN2 is connected to the ground terminal VSS. The other end of the current path of the transistor YN2 is connected to the node ND3. A control signal SEN1 is supplied to the gate of the transistor YN2.

One end of the current path of the transistor YP3 is connected to the node ND4. The other end of the current path of the transistor YP3 is connected to the node ND2. The gate of the transistor YP3 is connected to the node ND3.

One end of the current path of the transistor YP4 is connected to the voltage terminal VRD. The other end of the current path of the transistor YP4 is connected to the node ND2. The control signal SEN2 is supplied to the gate of the transistor YP4.

One end of the current path of the transistor YN3 is connected to the ground terminal VSS. The other end of the current path of the transistor YN3 is connected to the node ND4. The gate of the transistor YN3 is connected to the node ND3 and the gate of the transistor YP3.

The current path of the transistor YN4 is connected in parallel with the current path of the transistor YN3. One end of the current path of the transistor YN4 is connected to the ground terminal VSS. The other end of the current path of the transistor YN4 is connected to the node ND4. The control signal SEN1 is supplied to the gate of the transistor YN4.

The sense amplifier circuit 400A shown in FIG. 17 is activated by controlling the signal level of the control signal SEN1 and the signal level of the control signal SEN2.

As in the sense amplifier circuit shown in FIG. 11 described above, for example, data in the selected cell MCk is discriminated in accordance with the magnitude relationship between the potential of the nodes ND1 and ND3 and the potential of the nodes ND2 and ND4. The data of the selected cell MCk is thus output from the output terminal DOUT. In addition, complementary data of the data of the selected cell MCk is output from the output terminal bDOUT.

FIG. 18 is an equivalent circuit diagram showing an example of the internal configuration of the adjustment circuit in the read circuit of the MRAM according to this embodiment.

For example, the adjustment circuit 409A is a current mirror circuit.

As shown in FIG. 18, the adjustment circuit 409A includes two p-type transistors QA and QB.

One end of the current path of the transistor QA is connected to the voltage terminal VREF. The other end of the current path of the transistor QA is connected to a node NDC. The gate of the transistor QA is connected to the node NDC.

One end of the current path of the transistor QB is connected to the voltage terminal VREF. The other end of the current path of the transistor QB is connected to a node NDD. The gate of the transistor QB is connected to the gate of the transistor QA and the other end of the current path of the transistor QA.

The node NDC is connected to the reference cell array 149. The node NDD is connected to the input terminal ND2 of the sense amplifier circuit 400A.

The gate size of the transistor QA is larger than the gate size of the transistor QB.

For example, the gate width of the transistor QA is set to a size N times larger than a gate width W of the transistor QB.

As a result, the current IREF2 flowing to the transistor QB is 1/N of the current IREF1 flowing to the transistor QA.

Figure 19:
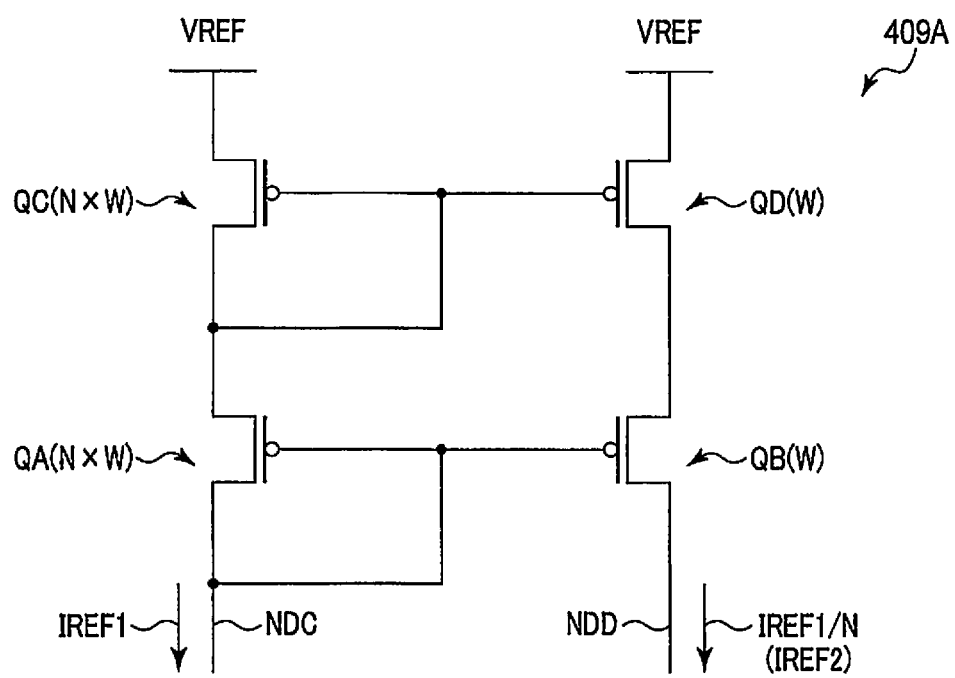

FIG. 19 is an equivalent circuit diagram showing an example of the adjustment circuit different from the example shown in FIG. 18.

As shown in FIG. 19, the adjustment circuit 409A may be a current mirror circuit having a cascode structure.

The adjustment circuit 409A shown in FIG. 19 includes four p-type transistors QA, QB, QC, and QD.

The current path of the transistor QC is connected in series between the voltage terminal VREF and the other end of the current path of the transistor QA. The gate of the transistor QC is connected to the other end of the current path of the transistor QA and one end of the current path of the transistor QC.

The current path of the transistor QD is connected in series between the voltage terminal VREF and the other end of the current path of the transistor QB. The gate of the transistor QD is connected to the gate of the transistor QC and one end of the current path of the transistor QC.

The gate size of the transistor QC is the same as the gate size of the transistor QA. The gate size of the transistor QD is the same as the gate size of the transistor QB. For example, the gate width of the transistor QC is set to the same size as the gate width of the transistor QA. The gate width of the transistor QD is set to the same size as the gate width of the transistor QB.

(4b) Operation Example

A read operation of the MRAM according to this embodiment will be described.

The read operation of the MRAM according to this embodiment is substantially the same as various kinds of control of the read operation explained in the first embodiment.

However, the read operation of the MRAM according to this embodiment is different from the above-described read operation in the following points.

In the sense amplifier circuit 400A, the nodes ND1 and ND3 are charged by the read current IRD. In the sense amplifier circuit 400A, the nodes ND2 and ND4 are charged by the reference current IREF2.

If the magnetization alignment of an MTJ element 100 in the selected cell MCk is the P state, the potential of the nodes ND1 and ND3 becomes higher than the potential of the nodes ND2 and ND4. In this case, the data of the selected cell MCk is determined to be "0" data.

If the magnetization alignment of the MTJ element 100 in the selected cell MCk is the AP state, the potential of the nodes ND2 and ND4 becomes higher than the potential of the nodes ND1 and ND3. In this case, the data of the selected cell MCk is determined to be "1" data.

Accordingly, a signal corresponding to the potential of the node ND1 is output from the output terminal DOUT as the data of the selected cell MCk. A signal corresponding to the potential of the node ND2 is output from the output terminal bDOUT as the complementary data of the data of the selected cell MCk.

The magnetic memory according to this embodiment can reduce the adverse effect of the variation in the reference current, as in the above-described embodiments.

As described above, the magnetic memory according to the fourth embodiment can improve the reliability of the operation, like the magnetic memories according to the above-described embodiments.

(5) Fifth Embodiment

A magnetic memory according to the fifth embodiment will be described with reference to FIG. 20.

FIG. 20 is a schematic view for explaining the circuit configuration of a magnetic memory (for example, an MRAM) according to this embodiment.

As shown in FIG. 20, an adjustment circuit 409Az may be connected to the high potential side of a selected cell MCk.

A current IRDz corresponding to a read current IRD of the selected cell MCk is supplied from the adjustment circuit 409Az to an input terminal ND1 of a sense amplifier circuit 400A.

The adjustment circuit 409Az has substantially the same structure as the circuit 409A shown in FIG. 18 or 19. A node NDC of the adjustment circuit 409Az is connected to the selected cell MCk, and a node NDD of the adjustment circuit 409Az is connected to the input terminal ND1 of the sense amplifier circuit 400A.

The current value of the current IRDz is set to about 1/M of the current value of the read current IRD by, for example, the adjustment circuit 409Az.

In a case in which the adjustment circuit 409Az is provided on the side of the selected cell MCk, a read voltage VRD is applied to the selected cell MCk via the adjustment circuit 409Az, and a reference voltage VREF higher than the read voltage VRD is applied to a reference cell array 149 via an adjustment circuit 409A.

The magnetic memory according to the fifth embodiment can improve the reliability of the operation, as in the above-described embodiments.

(6) Sixth Embodiment

A magnetic memory according to the sixth embodiment will be described with reference to FIGS. 21 and 22.

(6a) Configuration Example

FIG. 21 is a schematic view for explaining the circuit configuration of a magnetic memory (for example, an MRAM) according to this embodiment.

In the read circuit of the MRAM according to this embodiment, a sense amplifier circuit 400B may be a voltage sense type sense amplifier circuit.

As shown in FIG. 21, the sense amplifier circuit 400B includes a sense amplifier section SA and capacitors C1 and C2A.

The sense amplifier section SA performs sensing, amplification, and comparison of an input signal in the voltage sense type sense amplifier circuit 400B. The capacitor C1 holds a signal (charges) from a selected cell MCk. The capacitor C2A holds a reference signal (a signal from an adjustment circuit 409A).

One terminal of the capacitor C1 is connected to a first input terminal ND1 of the sense amplifier section SA. The other terminal of the capacitor C1 is connected to a ground terminal VSS.

The selected cell MCk is connected to a voltage terminal VRD via a switch M1 on the bit line side. The selected cell MCk is connected to one terminal of the capacitor C1 and the first input terminal ND1 of the sense amplifier section SA via a switch M2 on the source line side.

A reference cell array 149 is connected to one terminal of a capacitor C2B via a transistor TR2 and a switch RSW. The other terminal of the capacitor C2B is connected to the ground terminal VSS. The reference cell array 149 is connected to one node of the adjustment circuit 409A.

The adjustment circuit 409A is provided on the high potential side of the reference cell array 149. The other node of the adjustment circuit 409A is connected to one terminal of the capacitor C2A and a second input terminal ND2 of the sense amplifier section SA via a switch SW1. For example, in this embodiment, the adjustment circuit 409A has the configuration shown in FIG. 18 or 19. The reference cell array 149 may be connected to the adjustment circuit 409A via a transistor (or switch).

One terminal of the capacitor C2A is connected to the second input terminal ND2 of the sense amplifier section SA. The other terminal of the capacitor C2A is connected to the ground terminal VSS.

For example, the capacity of the capacitor C2B is set to N times of the capacity of the capacitor C2A. This makes the potential of the capacitor C2A substantially equal to the potential of the capacitor C2B at the time of generation of reference currents IREF1 and IREF2.

Note that the capacitors C1, C2A, and C2B used in a read circuit 14 are not limited to fixed capacitor elements, and the interconnect capacitances of interconnects that connect the circuits may be used as the capacitors.

FIG. 22 is an equivalent circuit diagram showing an example of the internal configuration of the voltage sense type sense amplifier circuit in the MRAM according to this embodiment.

As shown in FIG. 22, in the voltage sense type sense amplifier circuit 400B, the sense amplifier section SA includes four n-type transistors ZN1, ZN2, ZN3, and ZN4 and two p-type transistors ZP1 and ZP2.

One end of the current path of the transistor ZN1 is connected to a node ND3. The other end of the current path of the transistor ZN1 is connected to the node ND1. The gate of the transistor ZN1 is connected to the node ND2.

One end of the current path of the transistor ZN2 is connected to the ground terminal VSS. The other end of the current path of the transistor ZN2 is connected to the node ND3. A control signal SEN is supplied to the gate of the transistor ZN2.

One end of the current path of the transistor ZP1 is connected to the voltage terminal VRD. The other end of the current path of the transistor ZP1 is connected to the node ND1. The gate of the transistor ZP1 is connected to the node ND2 and the gate of the transistor ZN1.

One end of the current path of the transistor ZN3 is connected to a node ND4. The other end of the current path of the transistor ZN3 is connected to the node ND2. The gate of the transistor ZN3 is connected to the node ND1.

One end of the current path of the transistor ZN4 is connected to the ground terminal VSS. The other end of the current path of the transistor ZN4 is connected to the node ND4. The control signal SEN is supplied to the gate of the transistor ZN4.

One end of the current path of the transistor ZP2 is connected to the voltage terminal VRD. The other end of the current path of the transistor ZP2 is connected to the node ND2. The gate of the transistor ZP2 is connected to the node ND1 and the gate of the transistor ZN3.

The node ND1 is connected to the capacitor C1. The node ND2 is connected to the capacitor C2A. For example, in the voltage sense type sense amplifier circuit 400B, an output terminal DOUT is connected to the node ND1, and an output terminal bDOUT is connected to the node ND2.

In a read operation, the potential of the capacitor C1 is applied to the node ND1, and the potential of the capacitor C2A is applied to the node ND2.

The sense amplifier circuit 400B shown in FIG. 22 is activated by controlling the signal level of the control signal SEN.

As in the above-described sense amplifier circuits, for example, data in the selected cell MCk is discriminated in accordance with the magnitude relationship between the potential of the nodes ND1 and ND3 and the potential of the nodes ND2 and ND4. The data of the selected cell MCk is thus output from the output terminal DOUT. In addition, complementary data of the data of the selected cell MCk is output from the output terminal bDOUT.

(6b) Operation Example

The read operation of the MRAM according to this embodiment is executed as follows.

The MRAM according to this embodiment starts the read operation based on a read command CMD, as in the read operation of the MRAMs according to the above-described embodiments.

In the read operation, a bit line BL and a source line bBL are selected based on a selected address ADR. The selected cell MCk is thus activated. In addition, the reference cell array 149 is activated.

The read voltage VRD is applied to the selected cell MCk. A read current IRD according to the read voltage VRD flows in the selected cell MCk.

A reference voltage VREF is applied to the reference cell array 149.

In the read operation using the voltage sense type sense amplifier circuit 400B, the voltage value (absolute value) of the reference voltage VREF is larger than the voltage value of the read voltage VRD, as in the read operation using the current sense type sense amplifier circuit.

The reference current IREF1 according to the reference voltage VREF flows in the reference cell array 149. The reference current IREF1 is supplied to the adjustment circuit 409A. The adjustment circuit 409A outputs the reference current IREF2.

The capacitor C1 is charged by the read current IRD. The capacitor C2A is charged by the reference current IREF2.

The control signal SEN is set to "H" level, and the sense amplifier section SA is activated.

Accordingly, the sense amplifier section SA senses and amplifies the potentials (signal charge amounts) of the capacitors C1 and C2A. The sense amplifier section SA compares the potential of the capacitor C1 with the potential of the capacitor C2A.

For example, in the sense amplifier circuit 400B shown in FIG. 21, the potential of the capacitor C1 is supplied to the node ND1, and the potential of the capacitor C2A is supplied to the node ND2.

In the voltage sense type sense amplifier circuit 400B, one of the two nodes ND1 and ND2 is set to "H" level, and the other node is set to "L" level in accordance with the magnitude relationship between the potentials of the two nodes ND1 and ND2, as in the above-described current sense type sense amplifier circuit. As a result, it is determined whether the data of the selected cell MCk is "0" data or "1" data.

As described above, in the MRAM according to this embodiment, the data of the selected cell MCk is read by the voltage sense type sense amplifier circuit 400B.

The read data is transmitted from the MRAM according to this embodiment to the external device.

The read of the data of the MRAM according to this embodiment is thus completed.

(6c) Summary

In the magnetic memory according to this embodiment, the voltage sense type sense amplifier circuit is used in the read circuit.

In the data reading by the voltage sense type sense amplifier circuit, the voltage (voltage value) used to generate the reference signal is higher than the voltage (voltage value) used to generate the cell signal.

Even if the sense amplifier circuit of the read circuit is the voltage sense type sense amplifier circuit, as in the magnetic memory according to this embodiment, data reading can be executed by applying voltages of different voltage values to the reference circuit (reference cell array) and the selected cell.

Hence, the magnetic memory according to the sixth embodiment can obtain substantially the same effect as that of the magnetic memories according to the above-described embodiments.

(7) Seventh Embodiment

A magnetic memory according to the seventh embodiment will be described with reference to FIG. 23.

Figure 23:
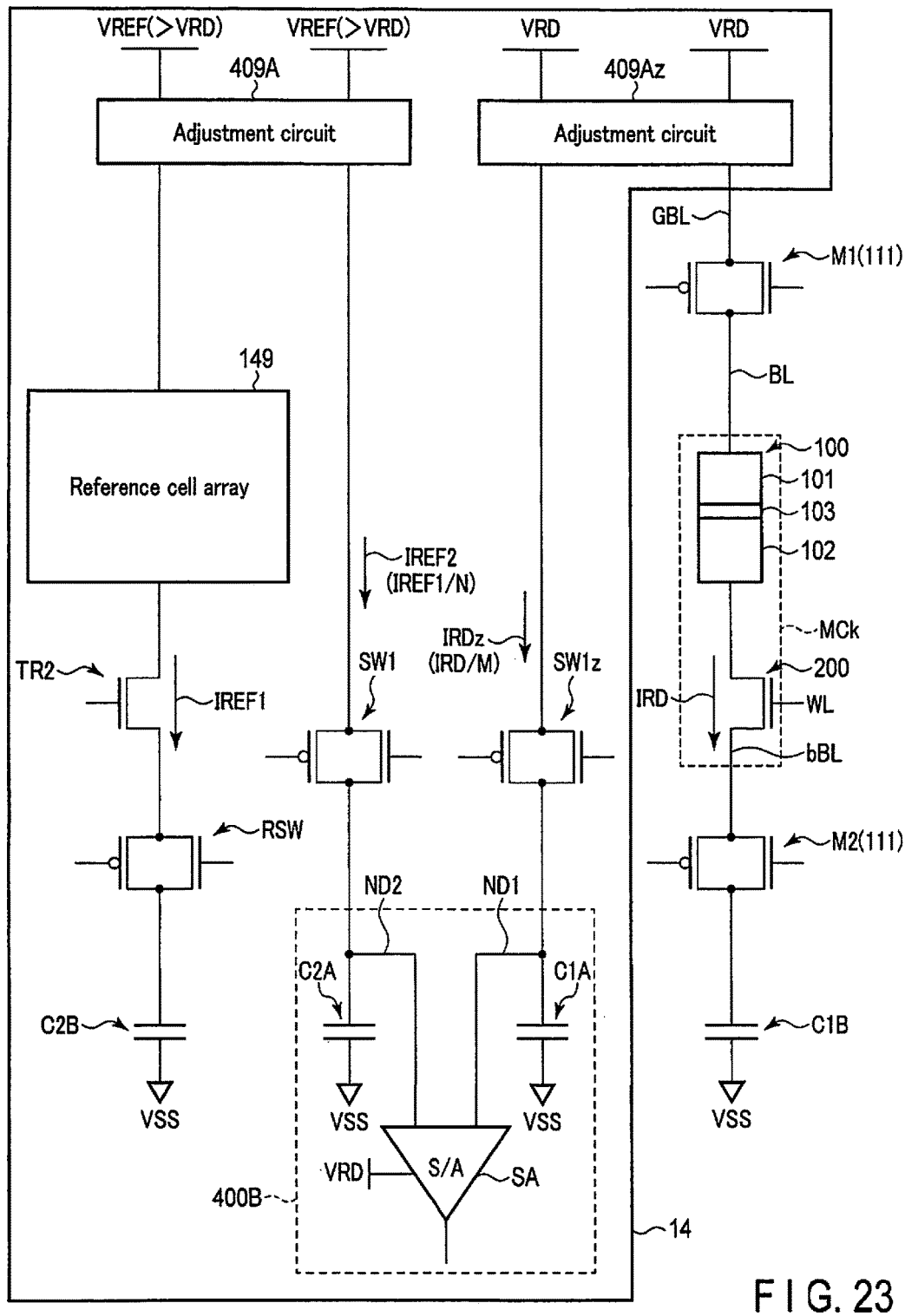
FIG. 23 is a view showing a configuration example of a magnetic memory according to the seventh embodiment.

FIG. 23 is a schematic view for explaining the circuit configuration of the magnetic memory (for example, an MRAM) according to this embodiment.

As shown in FIG. 23, in a read circuit including a voltage sense type sense amplifier circuit 400B, an adjustment circuit 409Az may be provided on the selected cell side.

A selected cell MCk is connected to one terminal of a capacitor C1B via a switch M2 on the source line side. The other terminal of the capacitor C1B is connected to a ground terminal VSS. The electrostatic capacitance of the capacitor C1B is set to M times of the electrostatic capacitance of a capacitor C1A. Accordingly, at the time of generation of read currents IRD and IRDz, the potential of the capacitor C1B becomes equal to the potential of the capacitor C1A.

The selected cell MCk is connected to the adjustment circuit 409Az via a switch M1 on the side of a bit line BL.

The adjustment circuit 409Az has substantially the same configuration as, for example, the configuration shown in FIG. 18 or 19. A node NDC of the adjustment circuit 409Az having the configuration shown in FIG. 18 (or FIG. 19) is connected to the selected cell MCk, and a node NDD of the adjustment circuit 409Az is connected to the sense amplifier circuit 400B.

One node NDC of the adjustment circuit 409Az is connected to the selected cell MCk.

The other node NDD of the adjustment circuit 409Az is connected to a first input terminal ND1 of a sense amplifier section SA and one terminal of the capacitor C1A via a switch SW1z. The other terminal of the capacitor C1A is connected to the ground terminal VSS.

The adjustment circuit 409Az supplies the current IRDz (=IRD/M) to the capacitor C1A of the sense amplifier circuit 400B. The current value of the current IRDz is 1/M of the current value of the read current IRD. The capacitor C1A is thus charged by the current IRDz. In the adjustment circuit 409Az, the gate width of the transistor on the side of the node NDC is set to M times of the gate width of the transistor on the side of the node NDD.

An adjustment circuit 409A supplies a current IREF2 (=IREF1/N) to a capacitor C2A of the sense amplifier circuit 400B. The capacitor C2A is thus charged by the current IREF2.

The sense amplifier section SA senses, amplifies, and compares the potential of the capacitor C1A and the potential of the capacitor C2A, as in the example of the sixth embodiment.

Data in the selected cell MCk is thus determined. The determination result is transmitted as read data from the MRAM 1 according to this embodiment to an external device.

As described above; the magnetic memory according to the seventh embodiment can improve the reliability of the operation, as in the above-described embodiments.

(8) Other Embodiments

In this embodiment, an MRAM is exemplified as the magnetic memory according to the embodiment. However, the embodiment is not limited to the MRAM as long as it is a magnetic memory using a magnetoresistive effect element.

In the MRAM serving as a memory device according to this embodiment, an in-plane magnetization type MTJ element may be used as the MTJ element. In the in-plane magnetization type MTJ element, the magnetization direction of magnetic layers (a storage layer and a reference layer) is substantially parallel to the layer surfaces of the magnetic layers. In the in-plane magnetization type MTJ element, as for the magnetic anisotropy of the magnetic layers, the magnetization direction of the magnetic layers is made substantially parallel to the layer surfaces of the magnetic layers using the shape magnetic anisotropy of the magnetic layers or the like. In the in-plane magnetization type MTJ element, the magnetization of the magnetic layers is set in a direction perpendicular to the stacking direction of the magnetic layers.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:
   a memory cell including a first magnetoresistive effect element;
   a reference circuit including a second magnetoresistive effect element having a first resistance state and a third magnetoresistive effect element having a second resistance state; and
   a read circuit configured to read data in the memory cell based on a first signal based on an output from the memory cell and a second signal based on an output from the reference circuit,
   wherein at a time of reading of the data,
   a first voltage is applied to the first magnetoresistive effect element, and
   a second voltage higher than the first voltage is applied to the second magnetoresistive effect element and the third magnetoresistive effect element.

2. The memory according to claim 1, wherein the read circuit includes:
   a first circuit configured to sense the first signal and the second signal; and
   a second circuit configured to adjust a difference between a signal value based on the first voltage and a signal value based on the second voltage,
   a first terminal of the first circuit is connected to the memory cell, and
   a second terminal of the first circuit is connected to the reference circuit via the second circuit.

3. The memory according to claim 2, wherein a first current of the reference circuit flows to a third terminal of the second circuit,
   a second current corresponding to the first current flows to a fourth terminal of the second circuit, and
   the second signal is generated from the second current.

4. The memory according to claim 2, wherein the second circuit includes:
   a first transistor including a first current path connected to the reference circuit, and a first gate having a first gate width and connected to one end of the first current path; and
   a second transistor including a second current path connected to the second terminal, and a second gate having a second gate width smaller than the first gate width and connected to the first gate.

5. The memory according to claim 2, wherein the read circuit further includes a third circuit,
   the third circuit includes:
   a fifth terminal which is connected to the memory cell and to which a third current of the memory cell flows; and
   a sixth terminal which is connected to the first terminal and to which a fourth current corresponding to the third current flows, and
   the first signal is generated from the fourth current.

6. The memory according to claim 5, wherein the third circuit includes:
   a third transistor including a third current path connected to the memory cell, and a third gate having a third gate width and connected to one end of the third current path; and
   a fourth transistor including a fourth current path connected to the first terminal, and a fourth gate having a fourth gate width smaller than the third gate width and connected to the third gate.

7. The memory according to claim 1, wherein the first magnetoresistive effect element has one of the first resistance state and the second resistance state in accordance with the data,
   a resistance value of the first magnetoresistive effect element having the first resistance state is higher than a resistance value of the first magnetoresistive effect element having the second resistance state.

8. The memory according to claim 1, wherein the resistance value of the first magnetoresistive effect element having the first resistance state in an application of the first voltage is higher than a resistance value of the second magnetoresistive effect element having the first resistance state in an application of the second voltage.

9. The memory according to claim 1, wherein the reference circuit further includes a fourth magnetoresistive effect element having the first resistance state and a fifth magnetoresistive effect element having the second resistance state,
   one end of the second magnetoresistive effect element is connected to a first node, the other end of the second magnetoresistive effect element is connected to one end of the third magnetoresistive effect element, and the other end of the third magnetoresistive effect element is connected to a second node,
   one end of the fourth magnetoresistive effect element is connected to the first node, the other end of the fourth magnetoresistive effect element is connected to one end of the fifth magnetoresistive effect element, and the other end of the fifth magnetoresistive effect element is connected to the second node.

10. A memory system comprising:
a magnetic memory including a memory cell, a reference circuit, and a read circuit, the memory cell including a first magnetoresistive effect element, the reference circuit including a second magnetoresistive effect element having a first resistance state and a third magnetoresistive effect element having a second resistance state, and the read circuit configured to read data in the memory cell based on a first signal based on an output from the memory cell and a second signal based on an output from the reference circuit; and
a processor connected to the magnetic memory,
wherein at a time of reading of the data,
a first voltage is applied to the first magnetoresistive effect element, and
a second voltage higher than the first voltage is applied to the second magnetoresistive effect element and the third magnetoresistive effect element.

11. The system according to claim 10, wherein the read circuit includes:
a first circuit configured to sense the first signal and the second signal; and
a second circuit configured to adjust a difference between a signal value based on the first voltage and a signal value based on the second voltage,
a first terminal of the first circuit is connected to the memory cell, and
a second terminal of the first circuit is connected to the reference circuit via the second circuit.

12. The system according to claim 11, wherein a first current of the reference circuit flows to a third terminal of the second circuit,
a second current corresponding to the first current flows to a fourth terminal of the second circuit, and
the second signal is generated from the second current.

13. The system according to claim 11, wherein the second circuit includes:
a first transistor including a first current path connected to the reference circuit, and a first gate having a first gate width and connected to one end of the first current path; and
a second transistor including a second current path connected to the second terminal, and a second gate having a second gate width smaller than the first gate width and connected to the first gate.

14. The system according to claim 11, wherein the read circuit further includes a third circuit, the third circuit includes:
a fifth terminal which is connected to the memory cell and to which a third current of the memory cell flows; and
a sixth terminal which is connected to the first terminal and to which a fourth current corresponding to the third current flows, and
the first signal is generated from the fourth current.

15. The system according to claim 14, wherein the third circuit includes:
a third transistor including a third current path connected to the memory cell, and a third gate having a third gate width and connected to one end of the third current path; and
a fourth transistor including a fourth current path connected to the first terminal, and a fourth gate having a fourth gate width smaller than the third gate width and connected to the third gate.

16. The system according to claim 10, wherein the first magnetoresistive effect element has one of the first resistance state and the second resistance state in accordance with the data,
a resistance value of the first magnetoresistive effect element having the first resistance state is higher than a resistance value of the first magnetoresistive effect element having the second resistance state.

17. The system according to claim 10, wherein the resistance value of the first magnetoresistive effect element having the first resistance state in an application of the first voltage is higher than a resistance value of the second magnetoresistive effect element having the first resistance state in an application of the second voltage.

18. The system according to claim 10, wherein the reference circuit further includes a fourth magnetoresistive effect element having the first resistance state and a fifth magnetoresistive effect element having the second resistance state,
one end of the second magnetoresistive effect element is connected to a first node, the other end of the second magnetoresistive effect element is connected to one end of the third magnetoresistive effect element, and the other end of the third magnetoresistive effect element is connected to a second node,
one end of the fourth magnetoresistive effect element is connected to the first node, the other end of the fourth magnetoresistive effect element is connected to one end of the fifth magnetoresistive effect element, and the other end of the fifth magnetoresistive effect element is connected to the second node.

* * * * *